US012648291B2

(12) United States Patent
Jung et al.

(10) Patent No.: US 12,648,291 B2

(45) Date of Patent: Jun. 2, 2026

(54) LIGHT-EMITTING DEVICE INCLUDING QUANTUM DOTS AND ELECTRONIC APPARATUS INCLUDING THE LIGHT-EMITTING DEVICE

(71) Applicant: Samsung Display Co., Ltd., Yongin-si (KR)

(72) Inventors: Yunku Jung, Yongin-si (KR); Yunhyuk Ko, Yongin-si (KR); Changyeol Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 543 days.

(21) Appl. No.: 18/155,965

(22) Filed: Jan. 18, 2023

(65) Prior Publication Data

US 2023/0320117 A1 Oct. 5, 2023

(30) Foreign Application Priority Data

Jan. 19, 2022 (KR) ........................ 10-2022-0007979

(51) Int. Cl.

*H10K 50/00* (2023.01)
*C09K 11/88* (2006.01)

(Continued)

(52) U.S. Cl.

CPC .......... *H10K 50/115* (2023.02); *C09K 11/883* (2013.01); *B82Y 20/00* (2013.01); *B82Y 40/00* (2013.01); *H10K 50/16* (2023.02)

(58) Field of Classification Search

CPC ...... H10K 50/115; H10K 50/16; H10K 50/15; H10K 59/38; H10K 30/865; H10K 59/123;

(Continued)

(56) References Cited

U.S. PATENT DOCUMENTS

| | | | | |
|---|---|---|---|---|
| 7,332,211 B1 * | 2/2008 | Bulovic | B05D 1/34 428/206 |
| 10,311,994 B2 | 6/2019 | He et al. | |

(Continued)

FOREIGN PATENT DOCUMENTS

| | | |
|---|---|---|
| JP | 2004022975 A | 1/2004 |
| JP | 2004179247 A | 6/2004 |

(Continued)

OTHER PUBLICATIONS

International Search Report for PCT/KR2023/000910 dated Apr. 26, 2023.

(Continued)

*Primary Examiner* — Sheikh Maruf

(74) *Attorney, Agent, or Firm* — CANTOR COLBURN LLP

(57) ABSTRACT

A light-emitting device including: a first electrode; a second electrode facing the first electrode; and an interlayer located between the first electrode and the second electrode, wherein the interlayer includes an emission layer, and wherein the emission layer includes a first quantum dot and a second quantum dot, wherein an energy band gap of the first quantum dot is greater than an energy band gap of the second quantum dot, and wherein the first quantum dot emits light of a partial wavelength region of a visible light region.

19 Claims, 3 Drawing Sheets

(51) Int. Cl.

| | |
|---|---|
| ***H10K 50/115*** | (2023.01) |
| *B82Y 20/00* | (2011.01) |
| *B82Y 40/00* | (2011.01) |
| *H10K 50/16* | (2023.01) |

(58) Field of Classification Search

CPC ...... H10K 59/40; C09K 11/883; C09K 11/88; B82Y 20/00; B82Y 40/00

USPC ............................................................ 257/40

See application file for complete search history.

(56) References Cited

U.S. PATENT DOCUMENTS

| | | | | |
|---|---|---|---|---|
| 11,005,060 | B2 | 5/2021 | Chung et al. | |
| 11,139,441 | B2 | 10/2021 | Chang et al. | |
| 11,566,345 | B2 | 1/2023 | Kim et al. | |
| 11,917,845 | B2 | 2/2024 | Lee et al. | |
| 2009/0127576 | A1* | 5/2009 | Jang | C09K 11/883 257/E33.061 |
| 2011/0240960 | A1* | 10/2011 | Kim | C09K 11/02 257/13 |
| 2018/0166642 | A1* | 6/2018 | Xie | H10K 50/115 |
| 2018/0215695 | A1* | 8/2018 | Chen | H10K 50/115 |
| 2019/0044034 | A1* | 2/2019 | Hyun | H05B 33/20 |
| 2019/0115492 | A1* | 4/2019 | Tamma | H10H 20/855 |
| 2019/0198728 | A1* | 6/2019 | Tamma | H05B 33/145 |
| 2019/0257003 | A1* | 8/2019 | Kim | C09K 11/02 |
| 2019/0276734 | A1* | 9/2019 | Kim | H10K 50/15 |
| 2019/0280232 | A1* | 9/2019 | Chang | H10K 85/1135 |
| 2020/0198384 | A1* | 6/2020 | Bollstrom | B41M 3/006 |
| 2021/0091324 | A1 | 3/2021 | Jung et al. | |
| 2021/0226172 | A1* | 7/2021 | Chung | C09K 11/06 |
| 2021/0371736 | A1* | 12/2021 | Lee | C07C 211/09 |
| 2021/0380877 | A1* | 12/2021 | Ramasamy | C09K 11/025 |
| 2021/0384454 | A1* | 12/2021 | Zhang | H10K 71/00 |
| 2022/0020965 | A1* | 1/2022 | Park | H10K 59/8731 |
| 2022/0098481 | A1* | 3/2022 | Jung | C09K 11/70 |
| 2022/0162500 | A1* | 5/2022 | Wang | H10K 50/115 |
| 2023/0071604 | A1* | 3/2023 | Kim | H10K 50/115 |

FOREIGN PATENT DOCUMENTS

| | | | |
|---|---|---|---|
| JP | 2019-145505 | A | 8/2019 |
| KR | 1020160059547 | A | 5/2016 |
| KR | 101945128 | B1 | 2/2019 |
| KR | 20190057563 | A | 5/2019 |
| KR | 1020190106744 | A | 9/2019 |
| KR | 1020190110046 | A | 9/2019 |
| KR | 1020210036435 | A | 4/2021 |
| KR | 20210149963 | A | 12/2021 |

OTHER PUBLICATIONS

Oh Seongkeun et al: “Highly efficient white electroluminescent devices with hybrid double emitting layers of quantum dots and phosphorescent molecules”, Nanoscale, vol. 11, No. 19, Jan. 1, 2019 (Jan. 1, 2019), pp. 9276-9280.

Wan Ki Bae et al: “R/G/B/Natural White Light Thin Colloidal Quantum Dot-Based Light-Emitting Devices”, Advanced Materials, VCH Publishers, DE, vol. 26, No. 37, Aug. 25, 2014 (Aug. 25, 2014), pp. 6387-6393.

Yoon Suk-Young et al: “High-efficiency blue and white electroluminescent devices based on non-CD I-III-VI quantum dots”, Nano Energy, vol. 63, Sep. 1, 2019 (Sep. 1, 2019), p. 103869 ISSN: 2211-2855, DOI: 10.1016/j.nanoen.2019.103869.

* cited by examiner

LIGHT-EMITTING DEVICE INCLUDING QUANTUM DOTS AND ELECTRONIC APPARATUS INCLUDING THE LIGHT-EMITTING DEVICE

CROSS-REFERENCE TO RELATED APPLICATION

This application is based on and claims priority under 35 U.S.C. § 119 to Korean Patent Application No. 10-2022-0007979, filed on Jan. 19, 2022, in the Korean Intellectual Property Office, and all the benefits accruing therefrom under 35 U.S.C. § 119, the entire content of which is incorporated by reference herein.

BACKGROUND

1. Field

The present subject matter relates to a light-emitting device including quantum dots and an electronic apparatus including the same.

2. Description of the Related Art

Quantum dots can be utilized as materials that perform various optical functions (for example, a light conversion function, a light emission function, and the like) in optical members and various electronic apparatuses. Quantum dots, which are semiconductor nanocrystals with a quantum confinement effect, may have different energy bandgaps by control of the average particle size (D50) and composition of the nanocrystals, and thus may emit light of various emission wavelengths.

An optical member including such quantum dots may have the form of a thin film, for example, as a thin film patterned for each subpixel. Such an optical member may be used, for example, as a color conversion member of a device including various light sources.

Quantum dots may be used for a variety of purposes in various electronic apparatuses. For example, quantum dots may be used as light emitters. For example, quantum dots may be included in an emission layer of a light-emitting device including a pair of electrodes and the emission layer, and may serve as an emitter.

To implement high-definition optical members and electronic apparatuses, there is a continuing need for the development of quantum dots that emit blue light having a maximum emission wavelength of 490 nanometers (nm) or less, that has a high photoluminescence quantum yield (PLQY), and that does not include cadmium because it is a toxic element.

SUMMARY

One or more embodiments relate to a light-emitting device including quantum dots and an electronic apparatus including the light-emitting device.

Additional aspects will be set forth in part in the description which follows and, in part, will be apparent from the description, or may be learned by practice of the presented embodiments.

According to an aspect, a light-emitting device includes:

a first electrode, a second electrode facing the first electrode, and an interlayer located between the first electrode and the second electrode, wherein the interlayer includes an emission layer, and wherein the emission layer includes a first quantum dot and a second quantum dot, an energy band gap of the first quantum dot is greater than an energy band gap of the second quantum dot, and the first quantum dot emits light of a partial wavelength region of a visible light region.

According to another aspect, an electronic apparatus includes the light-emitting device.

BRIEF DESCRIPTION OF THE DRAWINGS

The above and other aspects, features, and advantages of certain exemplary embodiments will be more apparent from the following detailed description taken in conjunction with the accompanying drawing, in which.

DETAILED DESCRIPTION

Figure 1:
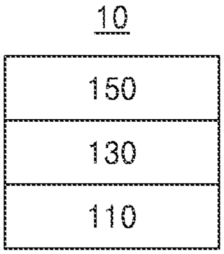
FIG. 1 is a schematic view of a light-emitting device according to one or more embodiments.

Reference will now be made in further detail to exemplary embodiments, examples of which are illustrated in the accompanying drawings, wherein like reference numerals refer to like elements throughout. In this regard, the present exemplary embodiments may have different forms and should not be construed as being limited to the detailed descriptions set forth herein. Accordingly, the exemplary embodiments are described in further detailed below, and by referring to the figures, to explain certain aspects of the present detailed description. As used herein, the term "and/or" includes any and all combinations of one or more of the associated listed items. As used herein, the singular forms "a," "an," and "the" are intended to include the plural forms as well, unless the context clearly indicates otherwise. The term "or" means "and/or." As used herein, expressions such as "at least one of," when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof.

The terminology used herein is for the purpose of describing one or more exemplary embodiments only and is not intended to be limiting. Because the detailed description may have diverse modified embodiments, exemplary embodiments are illustrated in the drawings and are described in the further detailed in the detailed description. An effect and/or a characteristic of the detailed description, and a method of accomplishing these will be apparent when referring to the one or more exemplary embodiments described herein and with reference to the drawings. The subject matter, however, may be embodied in different forms and should not be construed as limited to the one or more exemplary embodiments set forth herein.

It will be understood that although the terms "first," "second," etc. as used herein may be used to describe various elements, components, layers, and/or sections, these elements, components, regions, layers, and/or sections should not be limited by these terms. These components are used to distinguish one element, component region, layer, or section from another element, component, region, layer, or section. Thus, a first element, component, region, layer, or section discussed below could be termed a second element, component, region, layer, or section without departing from the teachings of the present embodiments.

An expression used in the singular encompasses the expression of the plural, unless it has a clearly different meaning in the context.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

In the present specification, it is to be understood that the terms such as "including," "having," and "comprising" are intended to indicate the existence of the features or components disclosed in the specification, and are not intended to preclude the possibility that one or more other features or components may exist or may be added. For example, unless otherwise limited, terms such as "including" or "having" may refer to either consisting of features or components described in the detailed description or further including other components. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "Group II" used herein may include a Group IIA element and a Group IIB element on the IUPAC Periodic Table of the Elements, and the Group II element may include, for example, magnesium (Mg), calcium (Ca), zinc (Zn), cadmium (Cd), and mercury (Hg).

The term "Group III" used herein may include a Group IIIA element and a Group IIIB element on the IUPAC Periodic Table of the Elements, and the Group III element may include, for example, aluminum (Al), gallium (Ga), indium (In), and thallium (TI).

The term "Group V" used herein may include a Group VA element and a Group VB element on the IUPAC Periodic Table of the Elements, and the Group V element may include, for example, nitrogen (N), phosphorus (P), arsenic (As), and antimony (Sb).

The term "Group VI" used herein may include a Group VIA element and a Group VIB element on the IUPAC Periodic Table of the Elements, and the Group VI element may include, for example, sulfur (S), selenium (Se), and tellurium (Te).

Hereinafter, a work function or a highest occupied molecular orbital (HOMO) energy level is expressed as an absolute value from a vacuum level. In addition, when the work function or the HOMO energy level is referred to be "deep," "high" or "large," the work function or the HOMO energy level has a large absolute value based on "0 electron Volts (eV)" of the vacuum level, while when the work function or the HOMO energy level is referred to be "shallow," "low," or "small," the work function or HOMO energy level has a small absolute value based on "0 eV" of the vacuum level.

The term "energy band gap" used herein may indicate intervals of conduction band minimum (CBM) and valence band maximum (VBM) energy levels. The VBM energy level may be measured through ambient photoelectron spectroscopy (APS) measurement, and the energy band gap may be measured by UV-Vis measurement. The CBM energy level may be calculated from the measured energy band gap and VBM energy level. Measurement may be performed after film formation by spin coating (2,500 revolutions per minute (rpm), 30 seconds) a solution having a concentration of 50 milligrams per milliliter (mg/ml) on an Au substrate under a nitrogen flow.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

A light-emitting device according to one or more embodiments may include: a first electrode;

a second electrode facing the first electrode; and an interlayer located between the first electrode and the second electrode and including an emission layer, wherein the emission layer may include a first quantum dot and a second quantum dot, an energy band gap of the first quantum dot may be greater than an energy band gap of the second quantum dot, and the first quantum dot may emit light of a partial wavelength region of a visible light region.

Hereinafter, the structure of the light-emitting device 10 according to one or more embodiments and a method of manufacturing the light-emitting device 10 will be described with reference to FIG. 1.

FIG. 1 is a schematic cross-sectional view of a light-emitting device 10 according to one or more embodiments. The light-emitting device 10 includes a first electrode 110, an interlayer 130, and a second electrode 150.

First Electrode 110

In FIG. 1, a substrate may be additionally located under the first electrode 110 or on the second electrode 150. As the substrate, a glass substrate or a plastic substrate may be used. In one or more embodiments, the substrate may be a flexible substrate, and may include plastics with excellent heat resistance and durability, such as a polyimide, polyethylene terephthalate (PET), a polycarbonate, polyethylene naphthalate, a polyarylate (PAR), a polyetherimide, or the like, or a combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or a combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or a combination thereof.

The first electrode 110 may have a single-layered structure consisting of a single layer or a multi-layered structure including a plurality of layers. For example, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region located between the first electrode 110 and the emission layer, and an electron transport region located between the emission layer and the second electrode 150.

The interlayer 130 may further include, in addition to various organic materials, a metal-containing compound such as an organometallic compound, an inorganic material such as quantum dots, or the like.

In one or more embodiments, the interlayer 130 may include, i) two or more emitting units sequentially stacked between the first electrode 110 and the second electrode 150, and ii) a charge generation layer located between the two or more emitting units. When the interlayer 130 includes emitting units and a charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer consisting of a plurality of different materials, or iii) a multi-layered structure including a plurality of layers including different materials.

The hole transport region may include a hole injection layer, a hole transport layer, an emission auxiliary layer, an electron blocking layer, or a combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, the layers of each structure being stacked sequentially from the first electrode 110.

The hole transport region may include a compound represented by Formula 201, a compound represented by Formula 202, or a combination thereof:

Formula 201

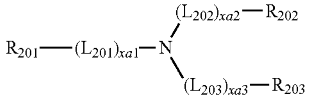

Formula 202

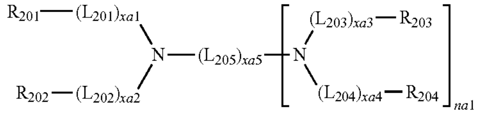

wherein, in Formulae 201 and 202, $L_{201}$ to $L_{204}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_6$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_6$-$C_{60}$ polycyclic group unsubstituted or substituted with at least one $R_{10a}$, and na1 may be an integer from 1 to 4.

For example, each of Formulae 201 and 202 may include at least one of groups represented by Formulae CY201 to CY217.

CY201

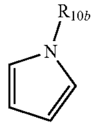

CY202

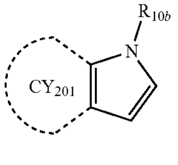

-continued

CY203

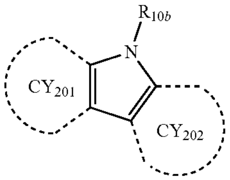

CY204

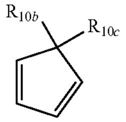

CY205

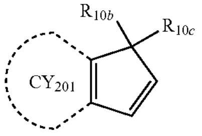

CY206

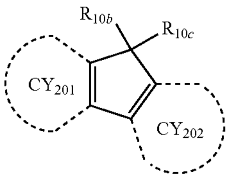

CY207

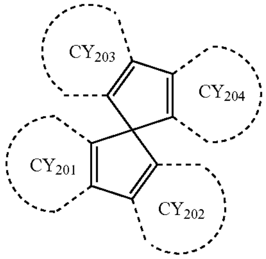

CY208

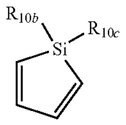

CY209

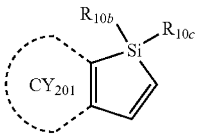

CY210

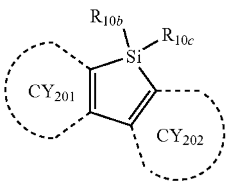

-continued

CY211

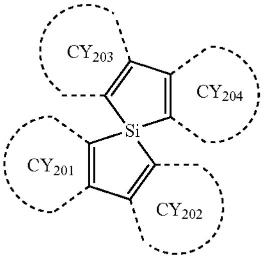

CY212

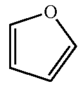

CY213

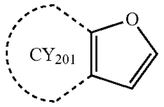

CY214

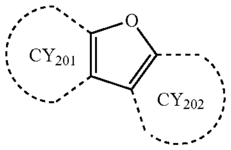

CY215

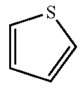

CY216

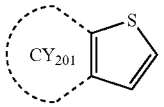

CY217

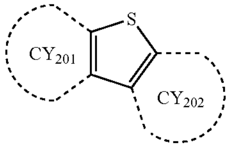

In Formulae CY201 to CY217, $R_{10b}$ and $R_{10c}$ may each be as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In one or more embodiments, ring CY201 to ring CY204 in Formulae CY201 to CY217 may each independently be a phenyl group, a naphthalene group, a phenanthrene group, or an anthracene group.

In one or more embodiments, each of Formulae 201 and 202 may include at least one of groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203, and may include at least one of the groups represented by Formulae CY204 to CY217.

In one or more embodiments, each of Formulae 201 and 202 may not include a group represented by one of Formulae CY201 to CY217.

In one or more embodiments, the hole transport region may include at least one of Compounds HT1 to HT46, 4,4',4"-tris(3-methylphenylphenylamino)triphenylamine (m-MTDATA), 4,4',4"-tris(N,N-diphenylamino)triphenylamine (TDATA), 4,4',4"-tris{N-(2-naphthyl)-N-phenylamino}-triphenylamine (2-TNATA), N,N'-di(1-naphthyl)-N,N'-diphenylbenzidine (NPB or NPD), β-NPB, N,N'-bis(3-methylphenyl)-N,N'-diphenyl-[1,1-biphenyl]-4,4'-diamine (TPD), spiro-TPD, spiro-NPB, methylated NPB, 4,4'-cyclohexylidene bis[N,N-bis(4-methylphenyl)benzenamine](TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or a combination thereof:

HT1

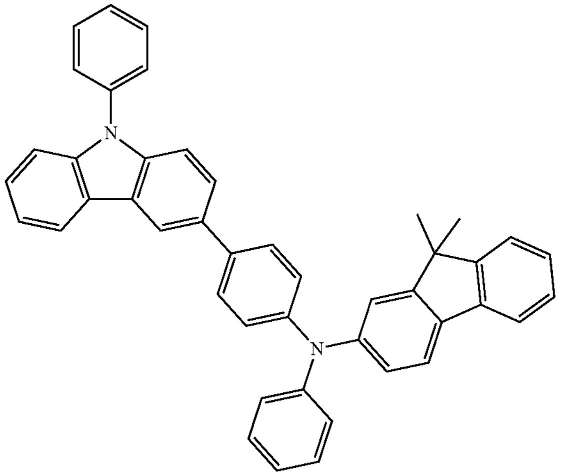

-continued

HT2

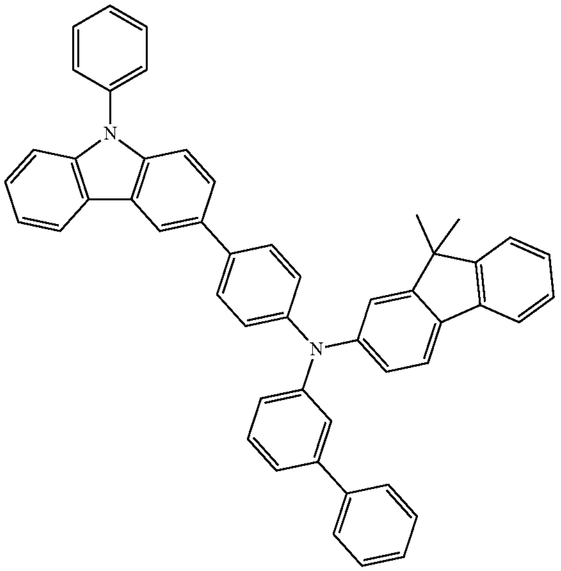

HT3

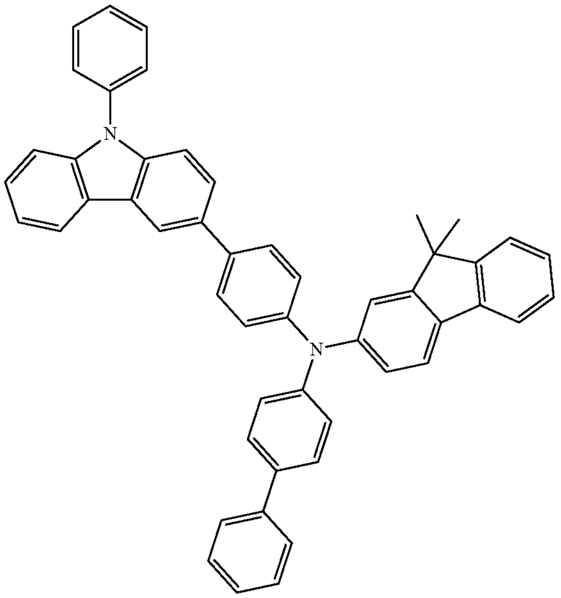

-continued
HT4
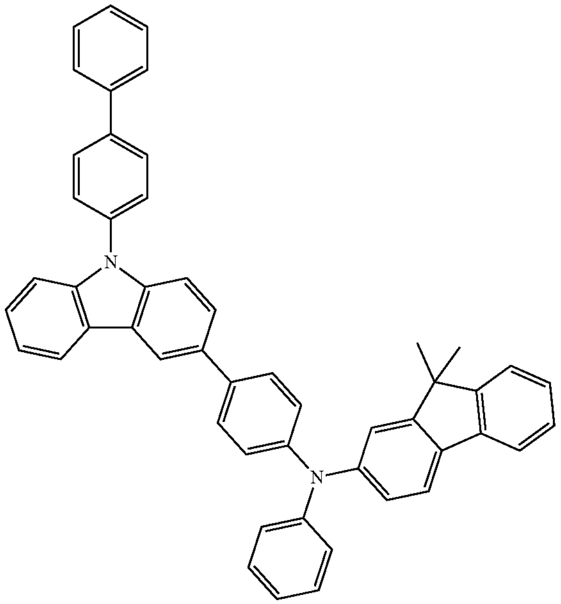
HT5
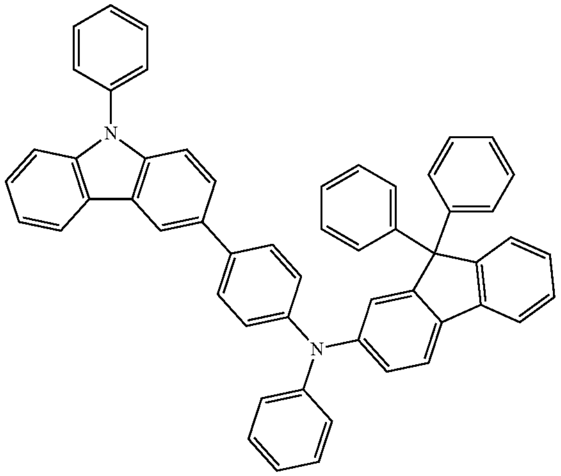
-continued
HT6
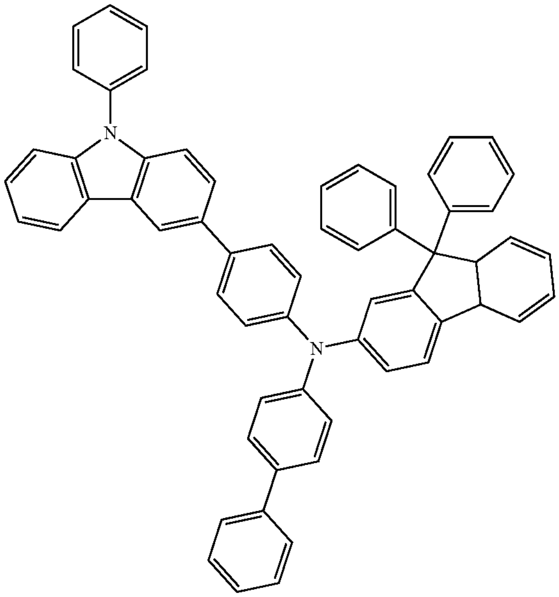
HT7
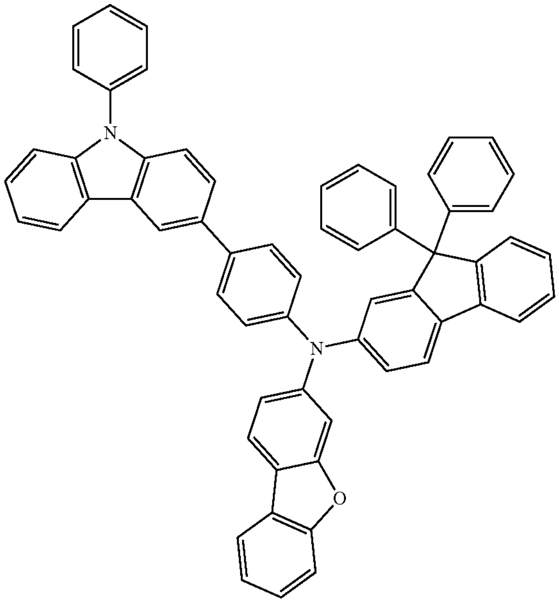

-continued
HT8
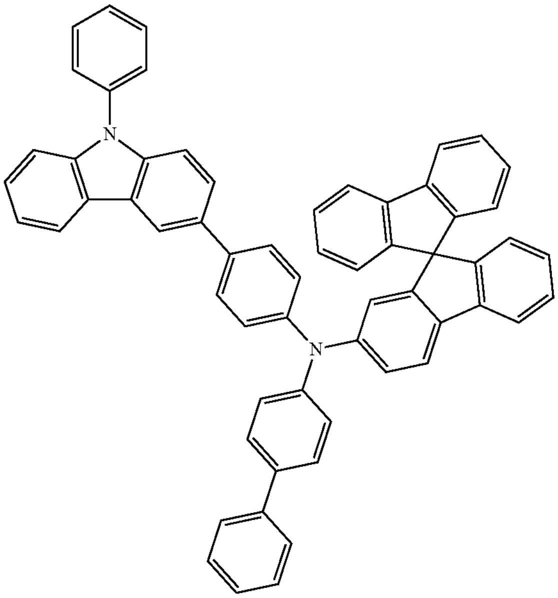
HT9
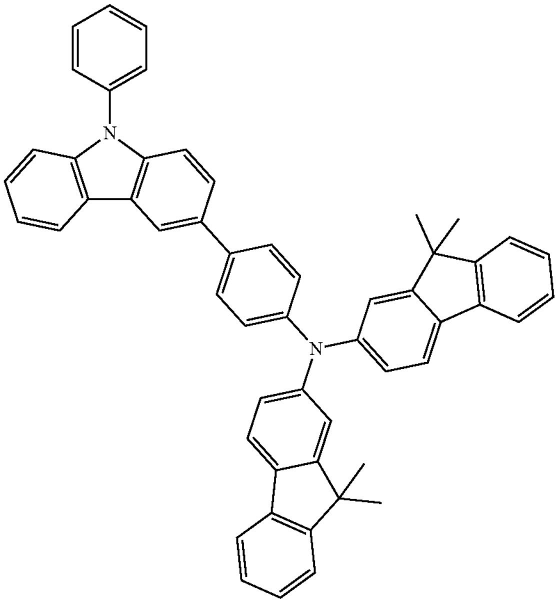
-continued
HT10
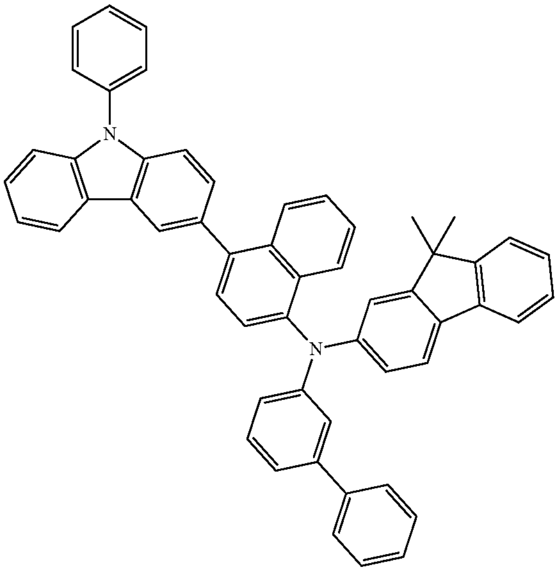
HT11
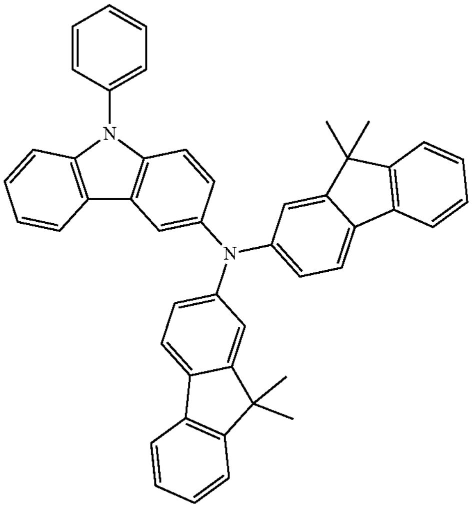
HT12
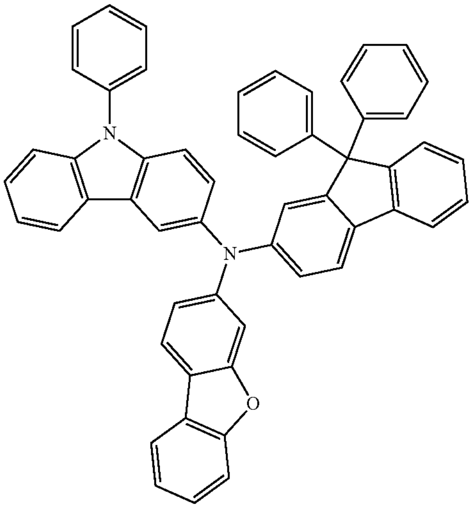

-continued
HT13
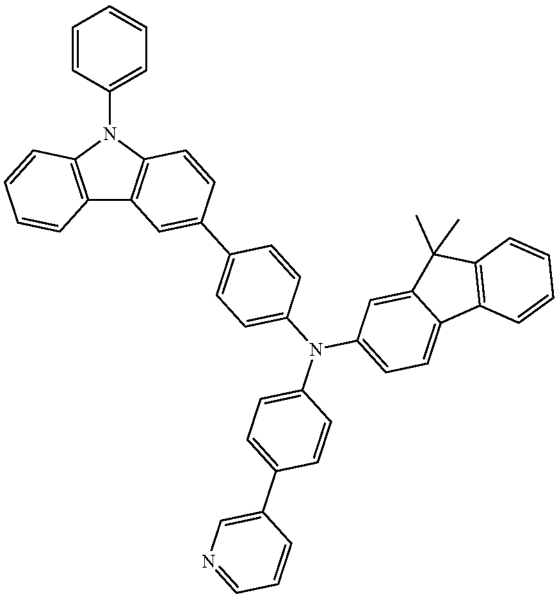
HT14
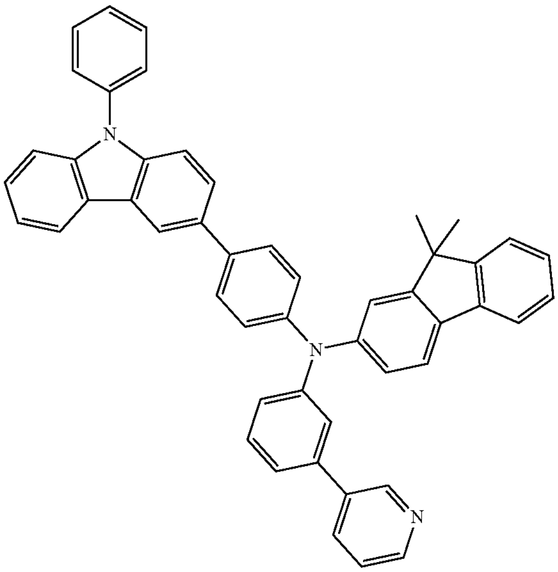
-continued
HT15
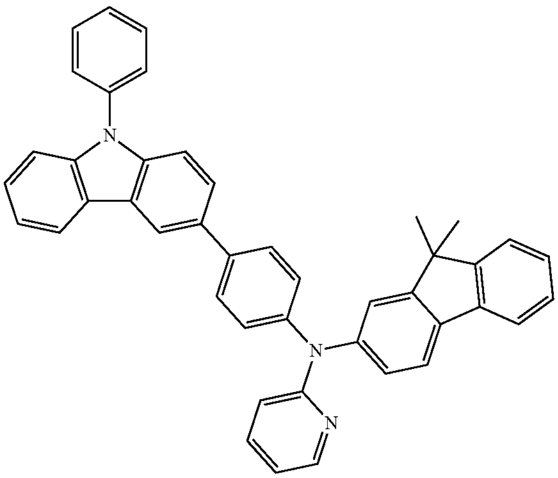
HT16
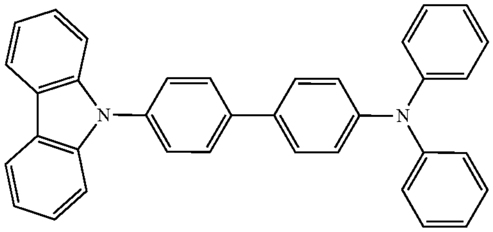
HT17
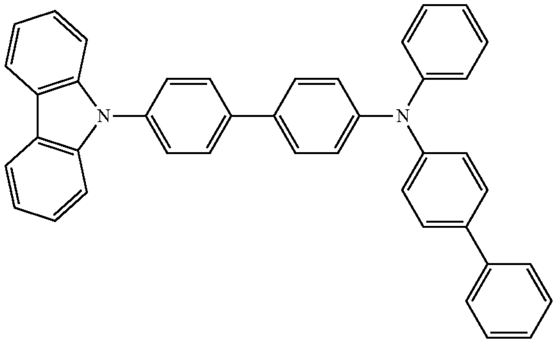
HT18
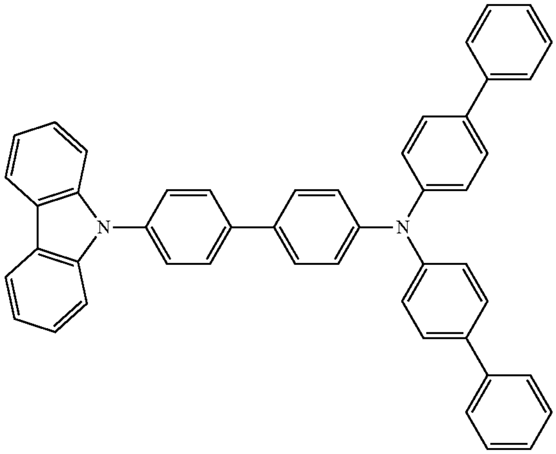

-continued
HT19
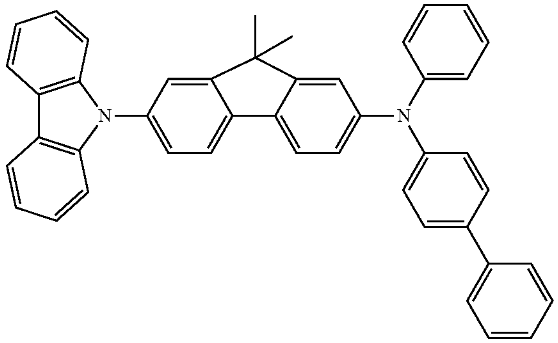
HT20
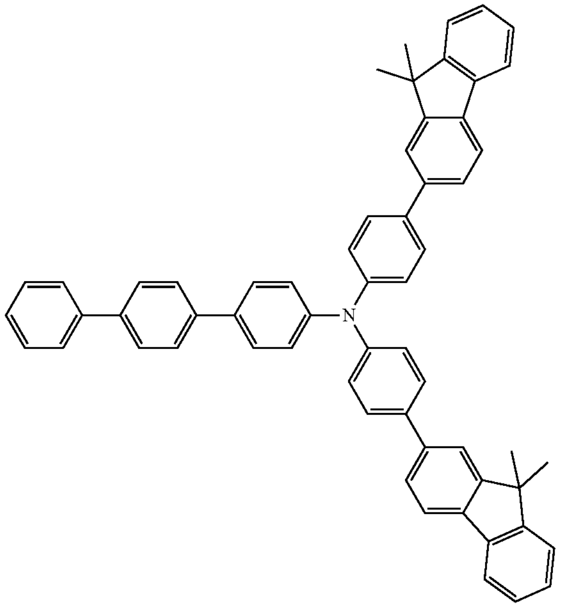
HT21
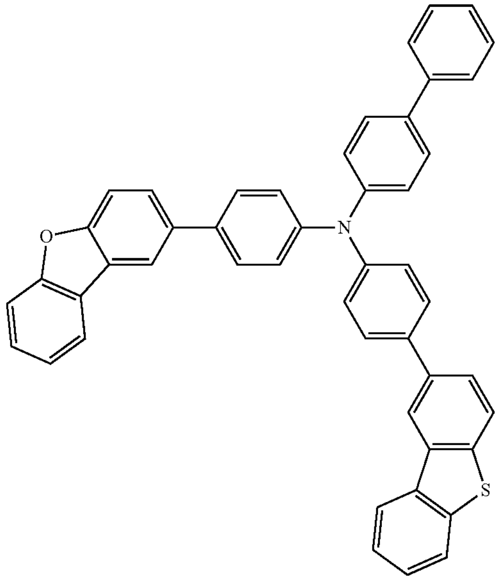
-continued
HT22
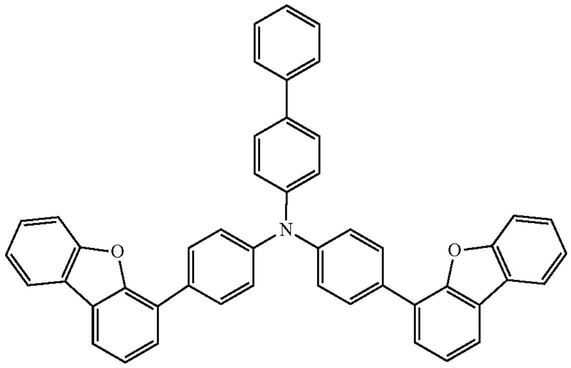
HT23
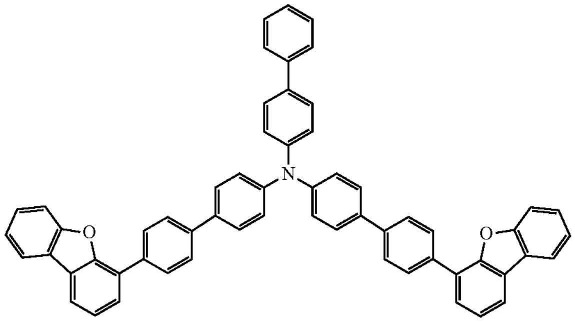
HT24
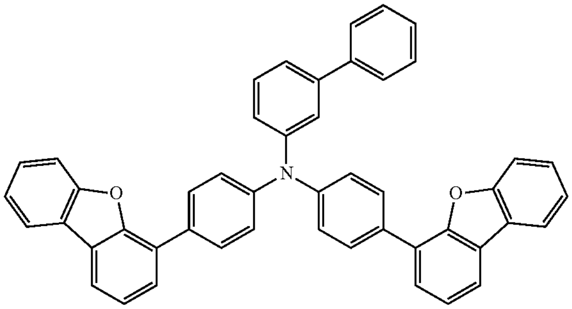

-continued
HT25
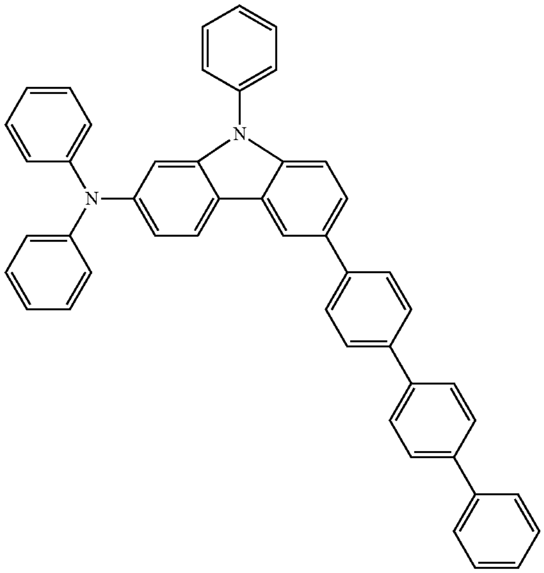
HT26
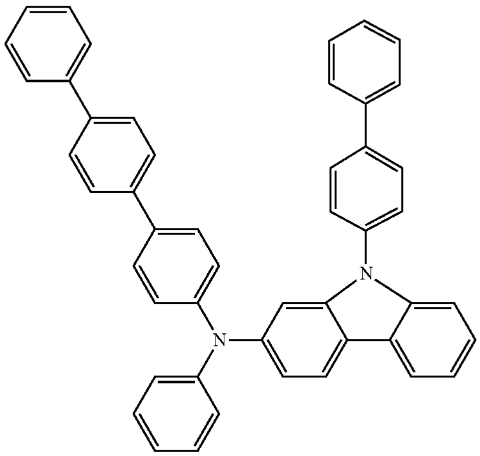
HT27
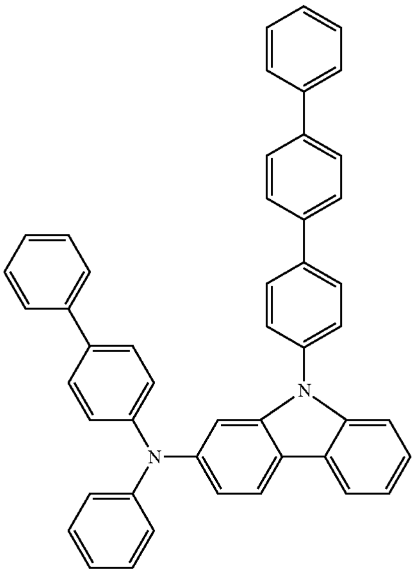
-continued
HT28
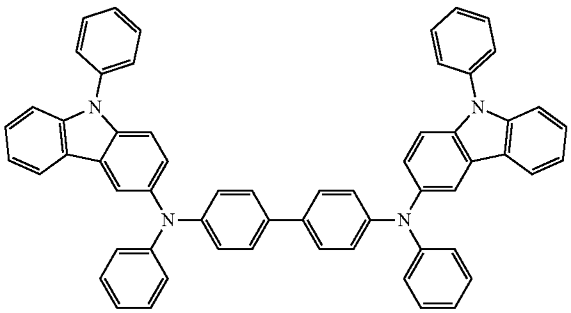
HT29
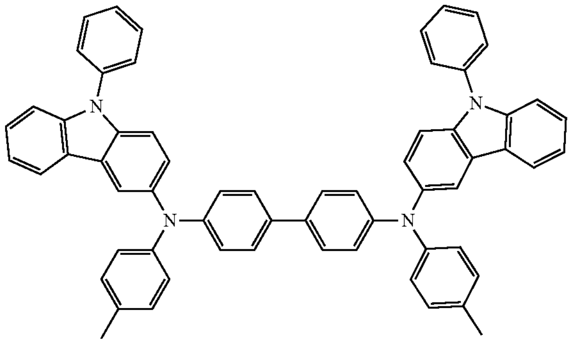
HT30
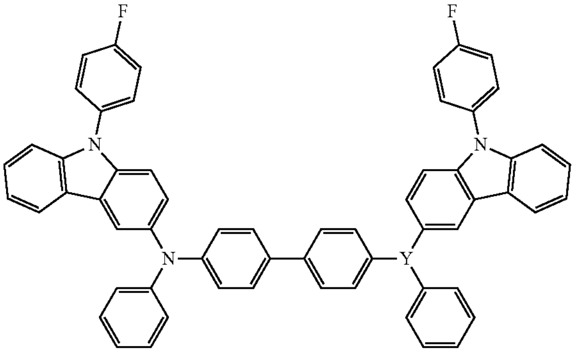
HT31
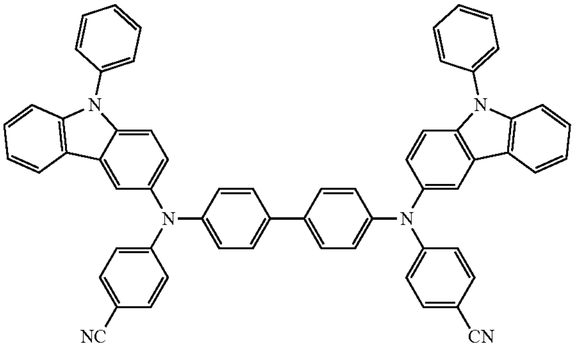

-continued
HT32
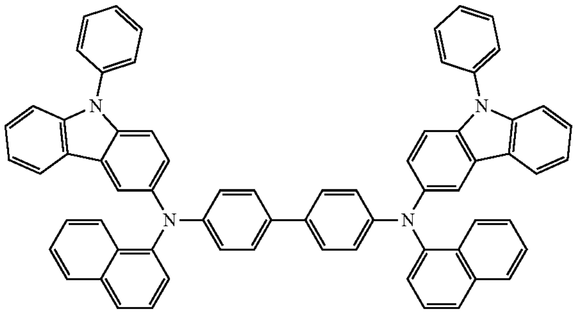
HT33
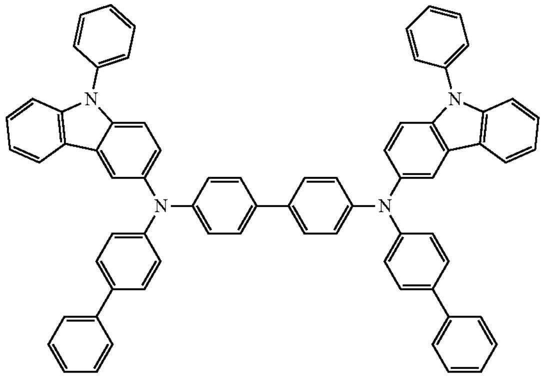
HT34
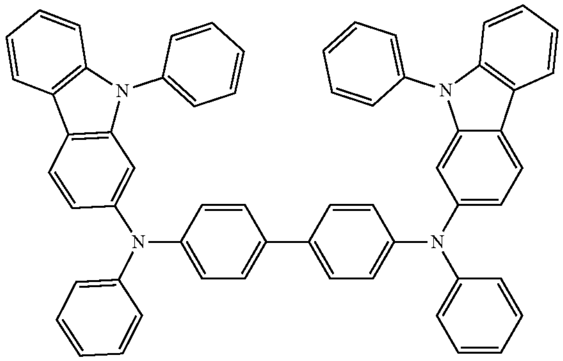
HT35
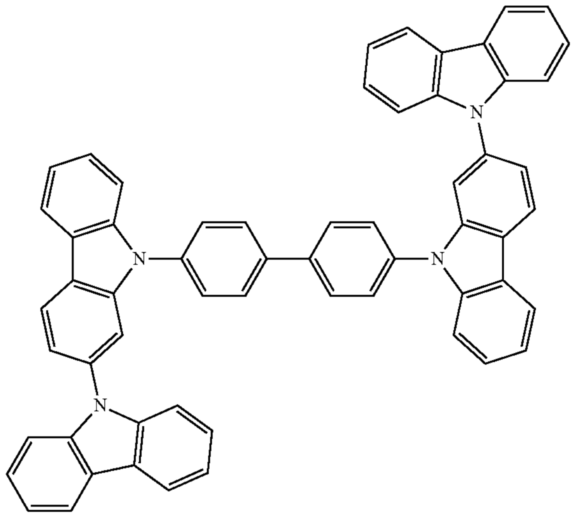
-continued
HT36
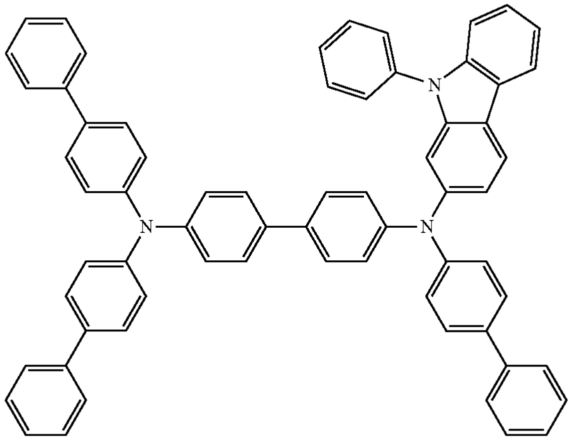
HT37
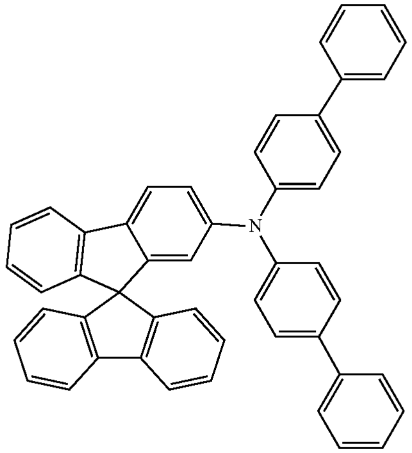
HT38
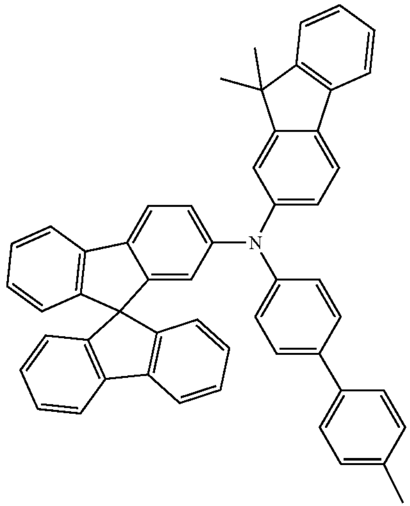

-continued
HT39
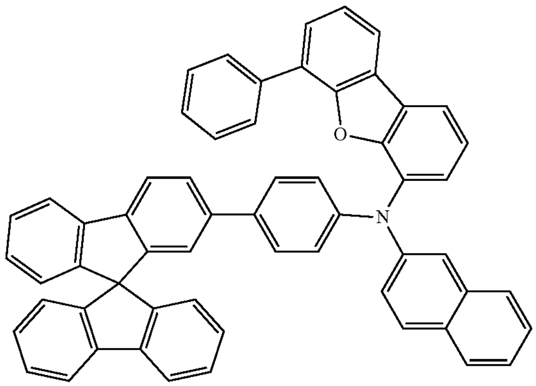
HT40
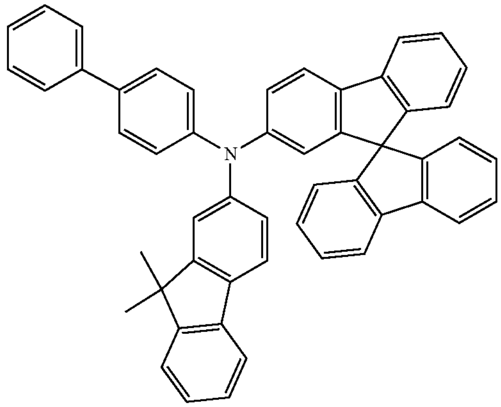
HT41
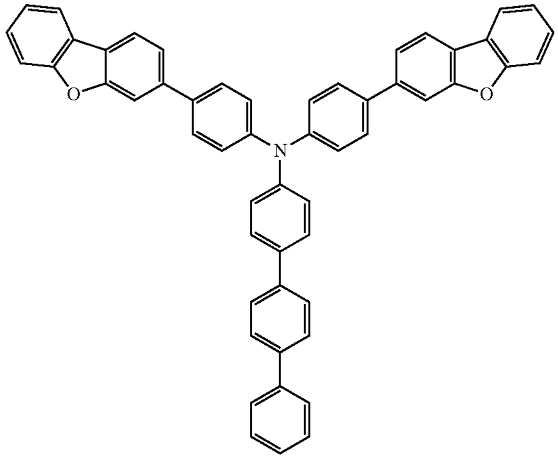
HT42
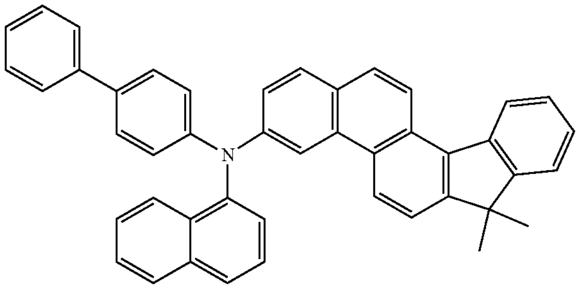
-continued
HT43
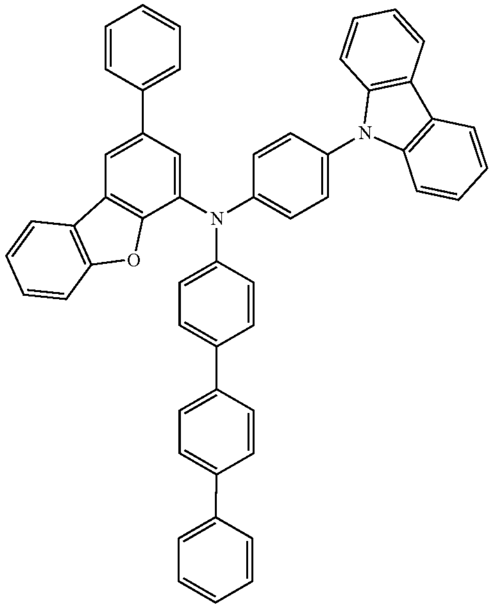
HT44
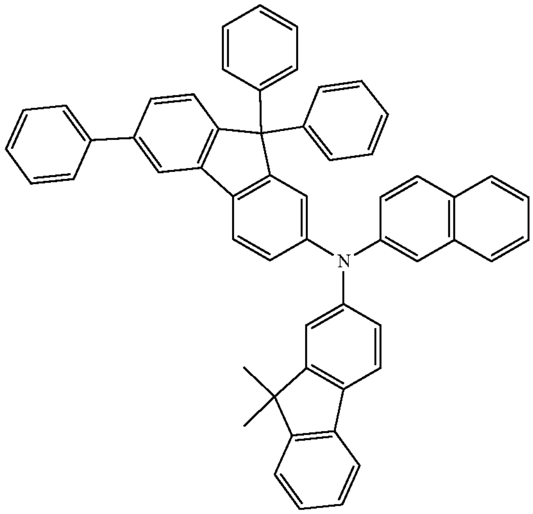
HT45
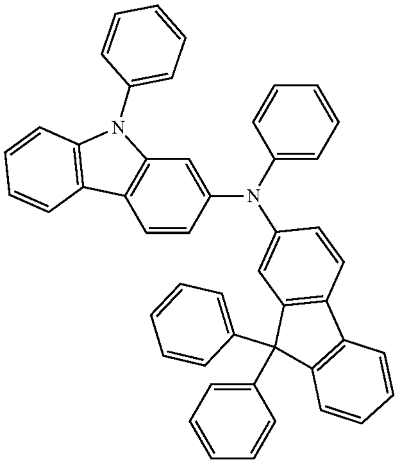

-continued
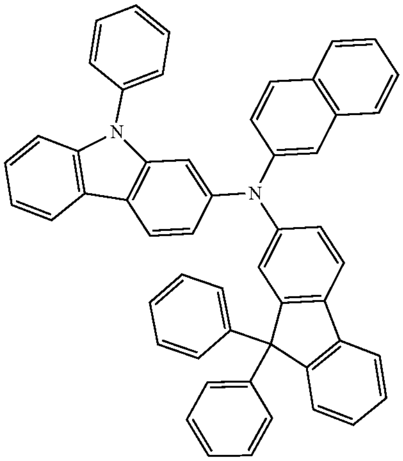
HT46
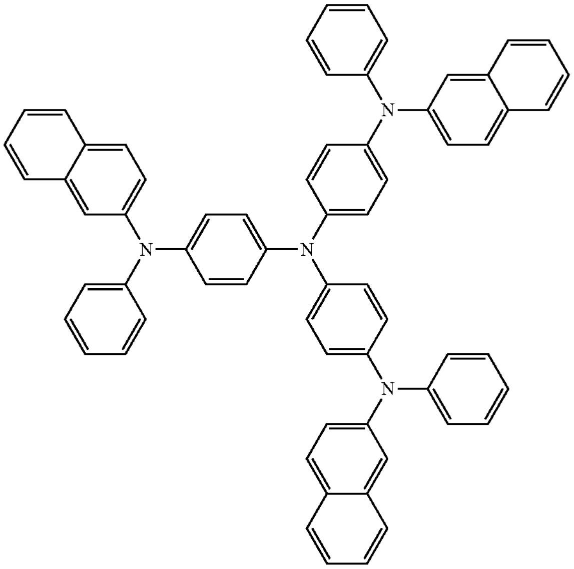
2-TNATA
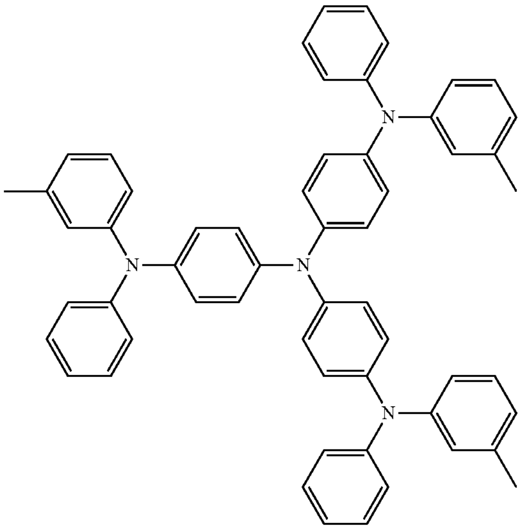
m-MTDATA
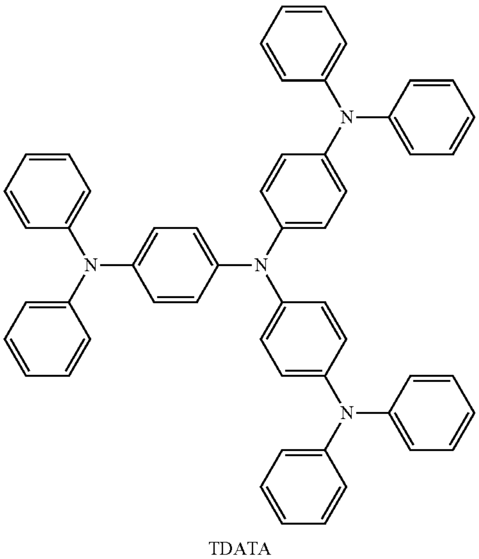
TDATA
-continued
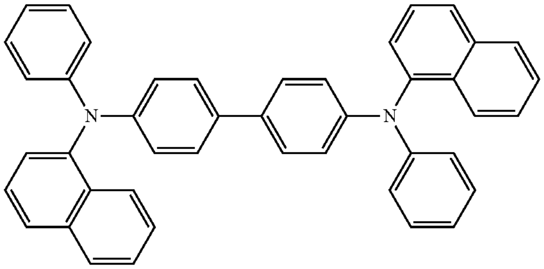
NPB
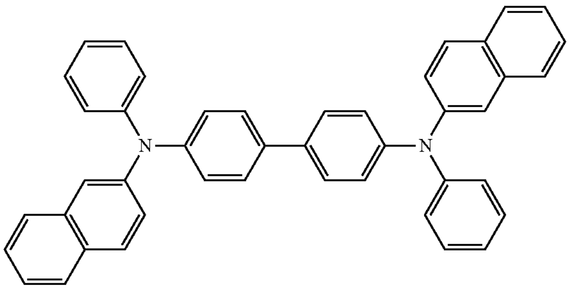
β-NPB
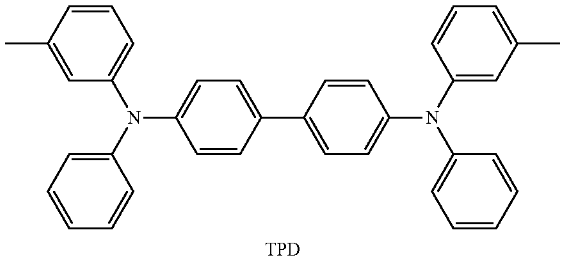
TPD -continued

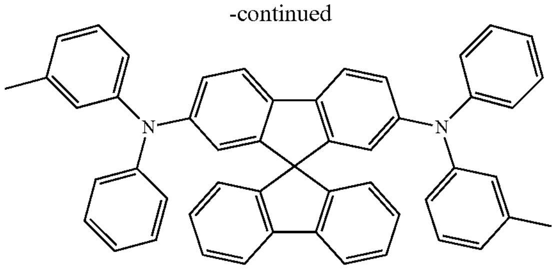

Spiro-TPD

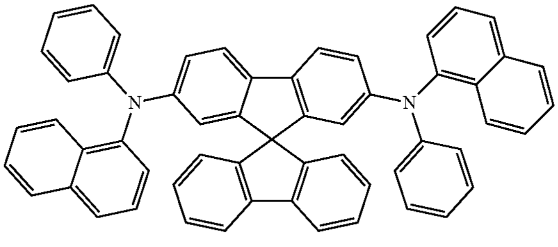

Spiro-NPB

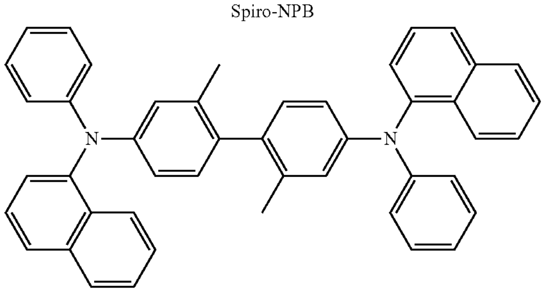

methylated-NPB

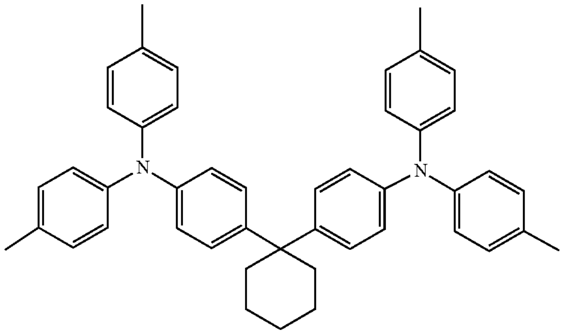

TAPC

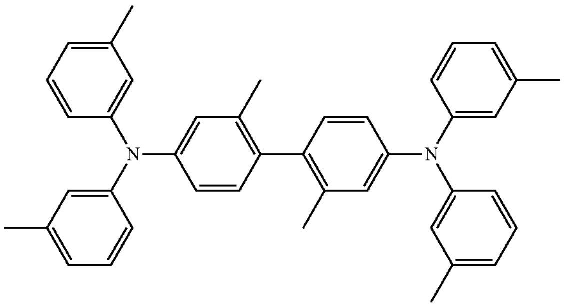

HMTPD

A thickness of the hole transport region may be in a range of about 50 angstroms (Å) to about 10,000 Å, for example, about 100 Å to about 4,000 Å. When the hole transport region includes a hole injection layer, a hole transport layer, or a combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the leakage of electrons from an emission layer to a hole transport region. Materials that may be included in the hole transport region may be included in the emission auxiliary layer and the electron blocking layer.

P-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, the lowest unoccupied molecular orbital (LUMO) energy level of the p-dopant may be about −3.5 electron volts (eV) or less.

In one or more embodiments, the p-dopant may include a quinone derivative, a cyano group-containing compound, a compound including element EL1 and element EL2, or a combination thereof.

Examples of the quinone derivative are 7,7,8,8-tetracyanoquinodimethane (TCNQ), 2,3,5,6-tetrafluoro-7,7,8,8-tetracyanoquinodimethane (F4-TCNQ), or the like Examples of the cyano group-containing compound are 1,4,5,8,9,11-hexaazatriphenylene-hexacarbonitrile (HAT-CN), or a compound represented by Formula 221:

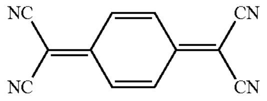

TCNQ

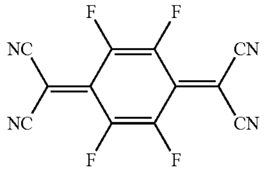

F4-TCNQ

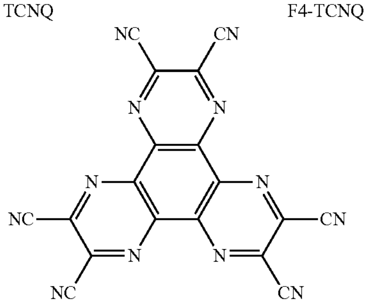

HAT-CN

Formula 221

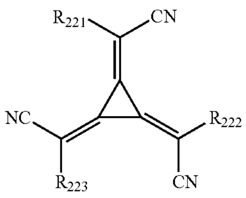

wherein, n Formula 221, $R_{221}$ to $R_{223}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with at least one of a cyano group; —F; —Cl; —Br; —I; a $C_1$-$C_{20}$ alkyl group substituted with at least one of a cyano group, —F, —Cl, —Br, —I, —$SF_5$, or a combination thereof.

In the compound including element EL1 and element EL2, element EL1 may be a metal, a metalloid, or a combination thereof, and element EL2 may be a non-metal, a metalloid, or a combination thereof.

Examples of the metal are an alkali metal (for example, lithium (Li), sodium (Na), potassium (K), rubidium (Rb), cesium (Cs), or the like); an alkaline earth metal (for example, beryllium (Be), magnesium (Mg), calcium (Ca), strontium (Sr), barium (Ba), or the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); a post-transition metal (for example, zinc (Zn), indium (In), tin (Sn), or the like); a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like), or the like, or a combination thereof.

Examples of the metalloid are silicon (Si), antimony (Sb), tellurium (Te), or the like, or a combination thereof.

Examples of the non-metal are oxygen (O), halogen (for example, F, Cl, Br, I, or the like), or the like, or a combination thereof.

Examples of the compound including element EL1 and element EL2 are a metal oxide, a metal halide (for example, metal fluoride, metal chloride, metal bromide, or metal iodide), a metalloid halide (for example, metalloid fluoride, metalloid chloride, metalloid bromide, or metalloid iodide), a metal telluride, or the like, or a combination thereof.

Examples of the metal oxide are a tungsten oxide (for example, WO, $W_2O_3$, $WO_2$, $WO_3$, $W_2O_5$, or the like), a vanadium oxide (for example, VO, $V_2O_3$, $VO_2$, $V_2O_5$, or the like), a molybdenum oxide (MoO, $Mo_2O_3$, $MoO_2$, $MoO_3$, $Mo_2O_5$, or the like), a rhenium oxide (for example, $ReO_3$, or the like), a niobium oxide, a tantalum oxide, a titanium oxide, a zinc oxide, a nickel oxide, a copper oxide, a cobalt oxide, a manganese oxide, a chromium oxide, an indium oxide, or the like, or a combination thereof.

Examples of the metal halide are alkali metal halides, alkaline earth metal halides, transition metal halides, post-transition metal halides, lanthanide metal halides, or the like, or a combination thereof.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, CsI, or the like, or a combination thereof.

Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $Be_{12}$, $Mg_{12}$, $CaI_2$, $Sr_{12}$, $BaI_2$, or the like, or a combination thereof.

Examples of the transition metal halide are a titanium halide (for example, $TiF_4$, $TiCl_4$, $TiBr_4$, $TiI_4$, or the like), a zirconium halide (for example, $ZrF_4$, $ZrCl_4$, $ZrBr_4$, $ZrI_4$, or the like), a hafnium halide (for example, $HfF_4$, $HfCl_4$, $HfBr_4$, $HfI_4$, or the like), a vanadium halide (for example, $VF_3$, $VCl_3$, $VBr_3$, $V_{13}$, or the like), a niobium halide (for example, $NbF_3$, $NbCl_3$, $NbBr_3$, $NbI_3$, or the like), a tantalum halide (for example, $TaF_3$, $TaCl_3$, $TaBr_3$, $TaI_3$, or the like), a chromium halide (for example, $CrF_3$, $CrCl_3$, $CrBr_3$, $CrI_3$, or the like), a molybdenum halide (for example, $MoF_3$, $MoCl_3$, $MoBr_3$, $MoI_3$, or the like), a tungsten halide (for example, $WF_3$, $WCl_3$, $WBr_3$, $WI_3$, or the like), a manganese halide (for example, $MnF_2$, $MnCl_2$, $MnBr_2$, $MnI_2$, or the like), a technetium halide (for example, $TcF_2$, $TcCl_2$, $TcBr_2$, $TcI_2$, or the like), a rhenium halide (for example, $ReF_2$, $ReCl_2$, $ReBr_2$, $ReI_2$, or the like), an iron halide (for example, $FeF_2$, $FeCl_2$, $FeBr_2$, $FeI_2$, or the like), a ruthenium halide (for example, $RuF_2$, $RuCl_2$, $RuBr_2$, $RuI_2$, or the like), an osmium halide (for example, $OsF_2$, $OsCl_2$, $OsBr_2$, $OsI_2$, or the like), a cobalt halide (for example, $CoF_2$, $CoCl_2$, $CoBr_2$, $CoI_2$, or the like), a rhodium halide (for example, $RhF_2$, $RhCl_2$, $RhBr_2$, $RhI_2$, or the like), an iridium halide (for example, $IrF_2$, $IrCl_2$, $IrBr_2$, $IrI_2$, or the like), a nickel halide (for example, $NiF_2$, $NiCl_2$, $NiBr_2$, $NiI_2$, or the like), a palladium halide (for example, $PdF_2$, $PdCl_2$, $PdBr_2$, $PdI_2$, or the like), a platinum halide (for example, $PtF_2$, $PtCl_2$, $PtBr_2$, $PtI_2$, or the like), a copper halide (for example, CuF, CuCl, CuBr, CuI, or the like), a silver halide (for example, AgF, AgCl, AgBr, AgI, or the like), a gold halide (for example, AuF, AuCl, AuBr, AuI, or the like), or the like, or a combination thereof.

Examples of the post-transition metal halide are a zinc halide (for example, $ZnF_2$, $ZnCl_2$, $ZnBr_2$, $ZnI_2$, or the like), an indium halide (for example, InIk, or the like), a tin halide (for example, $SnI_2$, or the like), or the like, or a combination thereof.

Examples of the lanthanide metal halide are YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, $SmI_3$, or the like, or a combination thereof.

An example of the metalloid halide is an antimony halide (for example, $SbCl_5$, or the like).

Examples of the metal telluride are an alkali metal telluride (for example, $Li_2Te$, $Na_2Te$, $K_2Te$, $Rb_2Te$, $Cs_2Te$, or the like), an alkaline earth metal telluride (for example, BeTe, MgTe, CaTe, SrTe, BaTe, or the like), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, or the like), a post-transition metal telluride (for example, ZnTe, or the like), a lanthanide metal telluride (for example, LaTe, CeTe, PrTe, NdTe, PmTe, EuTe, GdTe, TbTe, DyTe, HoTe, ErTe, TmTe, YbTe, LuTe, or the like), or the like, or a combination thereof.

Emission Layer in Interlayer 130

The emission layer may include a quantum dot. For example, the emission layer may include a plurality of quantum dots.

The term "quantum dot" and "quantum dots} as used herein refer to crystals of a semiconductor compound, and may include any material capable of emitting light of various emission wavelengths according to the particle size of the crystals.

A diameter of the quantum dot may be, for example, in a range of about 1 nanometers (nm) to about 10 nm.

The quantum dot may be synthesized by a wet chemical process, a metal organic chemical vapor deposition process, a molecular beam epitaxy process, or any suitable process similar thereto.

The wet chemical process is a method including mixing a precursor material with an organic solvent and then growing a quantum dot particle crystal. When the crystal grows, the organic solvent naturally acts as a dispersant coordinated on the surface of the quantum dot crystal and controls the growth of the crystal so that the growth of quantum dot particles can be controlled through a process which costs lower, and is easier than vapor deposition methods, such as metal organic chemical vapor deposition (MOCVD) or molecular beam epitaxy (MBE), The quantum dot may include Group II-VI semiconductor compounds, Group III-V semiconductor compounds, Group III-VI semiconductor compounds, Group I-III-VI semiconductor compounds, Group IV-VI semiconductor compounds, Group IV elements or compounds, or a combination thereof.

Examples of the Group II-VI semiconductor compound may include binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or a combination thereof.

Examples of the Group III-V semiconductor compound may include a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or a combination thereof. Meanwhile, the Group III-V semiconductor compound may further include a Group II element. Examples of the Group III-V semiconductor compound further including a Group II element may include InZnP, InGaZnP, InAlZnP, or the like Examples of the Group III-VI semiconductor compound may include a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; or a combination thereof.

Examples of the Group I-III-VI semiconductor compound may include a ternary compound, such as AgInS, $AgInS_2$, CuInS, $CuInS_2$, $CuGaO_2$, $AgGaO_2$, or $AgAlO_2$; or a combination thereof.

Examples of the Group IV-VI semiconductor compound may include a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or a combination thereof.

The Group IV element or compound may include a single element compound, such as Si or Ge; a binary compound, such as SiC or SiGe; or a combination thereof.

Each element included in a multi-element compound such as the binary compound, the ternary compound, and the quaternary compound may be present at a uniform concentration or a non-uniform (or variable) concentration in a particle.

Meanwhile, the quantum dot may have a single structure in which the concentration of each element in the quantum dot is uniform, or a core-shell dual structure. For example, the material included in the core and the material included in the shell may be different from each other.

The shell of the quantum dot may act as a protective layer that reduces or prevents chemical degeneration of the core to maintain semiconductor characteristics, and/or as a charging layer that imparts electrophoretic characteristics to the quantum dot. The shell may be a single layer shell or a multilayer shell having two or more discrete layers. The interface between the core and the shell may have a concentration gradient in which the concentration of an element existing in the shell decreases in a direction moving toward the center of the core and away from the outer most surface of the quantum dot.

Examples of the shell of the quantum dot may be an oxide of metal, a metalloid, or a non-metal, a semiconductor compound, or a combination thereof. Examples of the oxide of the metal, the metalloid, or the non-metal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or a combination thereof. Examples of the semiconductor compound may include, as described herein, a Group II-VI semiconductor compound; a Group III-V semiconductor compound; a Group III-VI semiconductor compound; a Group I-III-VI semiconductor compound; a Group IV-VI semiconductor compound; or a combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof.

A full width at half maximum (FWHM) of the emission wavelength spectrum of the quantum dot may be about 45 nm or less, for example, about 40 nm or less, for example, about 30 nm or less. Without wishing to be bound by theory, within these ranges, color purity or color reproducibility may be increased. In addition, since the light emitted through the quantum dot is emitted in all directions, the wide viewing angle may be improved.

In addition, the quantum dot may be in the form of a spherical particle, a pyramidal particle, a multi-arm particle, a cubic nanoparticle, a nanotube particle, a nanowire particle, a nanofiber particle, or a nanoplate particle.

Since the energy band gap may be adjusted by controlling the average particle size of the quantum dot, light having various wavelength bands may be obtained or emitted from the quantum dot emission layer. Accordingly, by using quantum dots of different average particle sizes, a light-emitting device that emits light of various wavelengths may be implemented. In one or more embodiments, the average particle size of the quantum dots may be selected to emit red, green and/or blue light. In addition, the average particle size of the quantum dots may be configured to emit white light by combination of light of various colors.

The emission layer includes a first quantum dot and a second quantum dot, wherein an energy band gap of the first quantum dot is greater than an energy band gap of the second quantum dot, and the first quantum dot emits light of a partial wavelength region of a visible light region.

In this regard, a second quantum dot having a smaller energy band gap may transfer holes or electrons to a first quantum dot having a greater energy band gap, and the first quantum dot to which the holes and electrons are transferred may emit light of a partial wavelength region of the visible light region (for example, a red light, a green light, and/or a blue light). Therefore, because the energy band gap includes two or more quantum dots different from each other, injection of holes or electrons into the emission layer may be improved, and thus, a light-emitting device having improved luminescence efficiency may be provided. As used herein, the term "partial wavelength region" means the first quantum dot emits light that includes only a portion of the visible light region, and therefore the first quantum dot does not emit a white light.

In one or more embodiments, a luminescent component emitted from the second quantum dot may be about 15% or less, about 10% or less, about 9% or less, about 8% or less, about 7% or less, about 6% or less, or about 5% or less of a total luminescent component emitted from the emission layer.

In one or more embodiments, the energy band gap of the first quantum dot may be about 2.8 electron Volts (eV) or less, about 2.79 eV or less, about 2.78 eV or less, about 2.77 eV or less, about 2.76 eV or less, or about 2.75 eV or less.

In one or more embodiments, the energy band gap of the second quantum dot may be about 1.90 eV to about 2.79 eV.

In one or more embodiments, a difference between the energy band gap of the first quantum dot and an energy band gap of the second quantum dot may be about 0.01 eV or greater, about 0.02 eV or greater, about 0.03 eV or greater, or about 0.04 eV or greater.

In one or more embodiments, the first quantum dot and the second quantum dot may each independently include a Group II-VI semiconductor compound, a Group III-V semiconductor compound, a Group III-VI semiconductor compound, a Group I-III-VI semiconductor compound, a Group IV-VI semiconductor compound, a Group IV element or compound, or a combination thereof.

In one or more embodiments, the first quantum dot may include a core and a shell covering at least part of the core of the first quantum dot, and the second quantum dot may include a core and may optionally further include a shell covering at least part of the core of the second quantum dot. Thus, the first quantum dot may have a core-shell structure, and the second quantum dot may have a single structure (core) or a core-shell structure.

In one or more embodiments, the core of the first quantum dot and the core of the second quantum dot may each independently include a Group II-VI semiconductor compound, a Group III-V semiconductor compound, or a combination thereof.

In one or more embodiments, the core of the first quantum dot and the core of the second quantum dot may each independently include CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

For example, the core of the first quantum dot and the core of the second quantum dot may each independently include ZnS, ZnSe, ZnTe, ZnSeS, ZnSeTe, ZnSTe, InP, InAs, InZnP, InGaP, InGaN, or a combination thereof.

In one or more embodiments, the shell of the first quantum dot and the shell of the second quantum dot may each independently include CdS, CdSe, CdTe, ZnS, ZnSe, ZnTe, ZnO, ZnSeS, ZnTeS, GaAs, GaP, GaN, GaO, GaSb, HgS, HgSe, HgTe, InAs, InP, InS, InZnP, InZnS, InGaP, InGaN, InSb, AlAs, AlP, AlSb, PbS, TiO, SrSe, or a combination thereof.

In one or more embodiments, the first quantum dot may include a core and a shell covering at least part of the core of the first quantum dot, and the shell may include two or more layers.

In one or more embodiments, the first quantum dot may include a core and a shell covering at least part of the core of the first quantum dot, the shell of the first quantum dot may include i) a first shell covering at least part of the core of the first quantum dot and ii) a second shell covering at least part of the first shell, the first shell and the second shell are different from each other, the second quantum dot may include a core and optionally may further include a shell covering at least part of the core of the second quantum dot, and the shell of the second quantum dot may be a single layer. Thus, the first quantum dot may have a core-first shell-second shell triple structure, and the second quantum dot may have a single structure (a core) or a core-shell double structure.

In one or more embodiments, when the first quantum dot has a core-first shell-second shell triple structure and the second quantum dot has a single structure (a core) or a core-shell double structure, the composition of the core of the first quantum dot and the core of the second quantum dot may be identical to each other, and the composition of the first shell of the first quantum dot and the shell of the second quantum dot may be identical to each other.

In one or more embodiments, the first quantum dot may include a core; a first shell covering at least part of the core of the first quantum dot; and a second shell covering at least part of the first shell; the second quantum dot may include a core; a first shell covering at least part of the core of the second quantum dot; and a second shell covering at least part of the first shell; and the average particle size of the core of the first quantum dot and the average particle size of the core of the second quantum dot may be different from each other. Thus, the first quantum dot and the second quantum dot may simultaneously have a core-first shell-second shell triple structure.

In one or more embodiments, when the first quantum dot and the second quantum dot simultaneously have a core-first shell-second shell triple structure, the average particle size of the core of the first quantum dot may be less than the average particle size of the core of the second quantum dot.

In one or more embodiments, when the first quantum dot and the second quantum dot simultaneously have a core-first shell-second shell triple structure, the core of the first quantum dot and the core of the second quantum dot may each independently include a first element, and an amount of the first element of the core of the first quantum dot may be different from an amount of the first element included in the second quantum dot.

The first element may correspond to a doping material of the core of the first quantum dot and the core of the second quantum dot. Even when the core of the first quantum dot and the core of the second quantum dot include the same element, the average particle size of the cores may be adjusted by varying the amount of the element (for example, the first element) corresponding to the doping material of the core.

For example, the core of the first quantum dot may include ZnSeTe and the Te amount in the core of the first quantum dot may be about 3.5 wt % based on 100 wt % of the total amount of the core of the first quantum dot, and the core of the second quantum dot may include ZnSeTe and the Te amount in the core of the second quantum dot may be about 7 wt % based on 100 wt % of the total amount of the core in the second quantum dot. In this regard, the average particle size of the core of the first quantum dot and the average particle size of the core of the second quantum dot may be identical to each other.

In one or more embodiments, the first quantum dot and the second quantum dot may each independently optionally include a ligand arranged on a surface of the shell.

In one or more embodiments, the ligand may include a hole transport ligand, an electron transport ligand, or a combination thereof.

In one or more embodiments, the hole transport ligand may include an aromatic hydrocarbon group compound. For example, the hole transport ligand may include an aromatic hydrocarbon group comprising a carboxylic acid group or a salt thereof, an aromatic hydrocarbon group comprising an amine group, an aromatic hydrocarbon group comprising an alcohol group, an aromatic hydrocarbon group comprising a thiol group, an aromatic hydrocarbon group comprising a phosphine oxide group, an aromatic hydrocarbon group comprising a phosphine group, an aromatic hydrocarbon group comprising a phosphonic acid group or a salt thereof, an aromatic hydrocarbon group comprising an ester group, an aromatic hydrocarbon group comprising an acid anhydride group or an equivalent thereof, or a combination thereof.

In one or more embodiments, the electron transport ligand may include an aliphatic hydrocarbon group compound, a halogen ion, $BF_4^-$, or a combination thereof. For example, the electron transport ligand may include an aliphatic hydrocarbon group comprising a carboxylic acid group or a salt thereof, an aliphatic hydrocarbon group comprising an amine group, an aliphatic hydrocarbon group comprising an alcohol group, an aliphatic hydrocarbon group comprising a thiol group, an aliphatic hydrocarbon group comprising a phosphine oxide group, an aliphatic hydrocarbon group comprising a phosphine group, an aliphatic hydrocarbon group comprising a phosphonic acid group or a salt thereof, an aliphatic hydrocarbon group comprising an ester group, an aliphatic hydrocarbon group comprising an acid anhydride group or an equivalent thereof, an aliphatic hydrocarbon group comprising a halogen-containing group, an aliphatic hydrocarbon group comprising an acyl halide group, a halogen ion, $BF_4^-$, or a combination thereof.

In one or more embodiments, an amount of the first quantum dot in the emission layer may be greater than an amount of the second quantum dot in the emission layer. For example, the amount of the first quantum dot in the emission layer may be greater than about 50 wt %, based on 100 wt % of a total amount of the first quantum dot and the second quantum dot in the emission layer.

A full width at half maximum (FWHM) of an emission wavelength spectrum of the first quantum dot and the second quantum dot may be about 45 nm or less, for example, about 40 nm or less, for example, about 30 nm or less, and within these ranges, color purity or color reproducibility may be increased. In addition, since the light emitted through the quantum dot is emitted in all directions, the wide viewing angle may be improved.

In addition, the first quantum dot and the second quantum dot may be, for example, a spherical, pyramidal, multi-arm, or cubic nanoparticle; a nanotube; a nanowire; a nanofiber; a nanoplate particle; or a combination thereof.

Since the energy band gap may be adjusted by controlling the average particle size (D50) of the quantum dot, light having various wavelength bands may be obtained from the emission layer. Accordingly, by using quantum dots of different average particle sizes, a light-emitting device that emits light of various wavelengths may be implemented. In one or more embodiments, the average particle size of the quantum dot may be selected to emit a red light, a green light, and/or a blue light. In addition, the average particle size of the quantum dot may be configured to emit a white light by combination of light of various colors.

The emission layer may be a quantum dot single layer or a structure wherein two or more quantum dot layers are stacked on top of each other. For example, the emission layer may be a quantum dot single layer or a structure wherein about 2 to about 100 quantum dot layers may be stacked.

The emission layer may further include a quantum dot that is different from the quantum dots as described herein.

The emission layer may further include, in addition to the quantum dot as described herein, a dispersion medium wherein the quantum dots are dispersed in a naturally coordinated form. The dispersion medium may include an organic solvent, a polymer resin, or a combination thereof. The dispersion medium may be any suitable transparent medium that does not significantly affect the optical performance of the quantum dot, is not significantly deteriorated by light, does not significantly reflect light, or does not significantly absorb light. For example, the solvent may include one or more of toluene, chloroform, ethanol, octane, or the like, or a combination thereof, and the polymer resin may include one or more of an epoxy resin, a silicone resin, a polystyrene resin, a (meth)acrylate resin, or the like, or a combination thereof.

The emission layer may be formed by coating, on the hole transport region, a quantum dot-containing composition for forming the emission layer, and volatilizing at least a portion of the solvent from the composition for forming the emission layer.

For example, as the solvent, water, hexane, chloroform, toluene, octane, or the like may be used.

The coating of the composition for forming the emission layer may be performed using a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, an ink jet printing method, or the like, or a combination thereof.

When the light-emitting device 10A is a full-color light-emitting device, the emission layer 150 may include one or more emission layers that emit a light of a different color from the color(s) of another one or more emission layers according to individual subpixels.

For example, the emission layer 150 may be patterned into a first color emission layer, a second color emission layer, and a third color emission layer according to individual subpixels. Here, at least one emission layer of the emission layers described herein may essentially include the quantum dot. In particular, the first color emission layer may be a quantum dot emission layer including the quantum dot, and the second color emission layer and the third color emission layer may be organic emission layers including organic compounds, respectively. In this regard, the first color through the third color are different colors, and for example, the first color through the third color may have different maximum luminescence wavelengths. The first color through the third color may be white when combined with each other.

In one or more embodiments, the emission layer may further include a fourth-color emission layer, and at least one emission layer of the first color to the fourth-color emission layers may be a quantum dot emission layer including the quantum dot, and the remaining emission layers may each be organic emission layers including organic compounds. Other various modifications are possible. In this regard, the first color through the fourth color are different colors, and for example, the first color through the fourth color may each have different maximum luminescence wavelengths. The first color through the fourth color may be white when combined with each other.

In one or more embodiments, the light-emitting device 10 may have a stacked structure wherein two or more emission layers that emit light of identical or different colors contact each other or are separated from each other. At least one emission layer of the at least two emission layers may be a quantum dot emission layer including the quantum dots, and the other emission layer may be an organic emission layer including one or more organic compounds. In particular, the light-emitting device 10 may include a first color emission layer and a second color emission layer, and the first color and the second color may be the same color or different colors. More particularly, the first color and the second color may be blue.

The emission layer may further include, in addition to the quantum dot, at least of an organic compound or a semiconductor compound.

In further detail, the organic compound may include a host and a dopant. The host and the dopant may include a host and a dopant that are commonly used in organic light-emitting devices, respectively.

In particular, the semiconductor compound may be an organic and/or inorganic perovskite.

Electron Transport Region in Interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region may include a buffer layer, a hole blocking layer, an electron control layer, an electron transport layer, an electron injection layer, or a combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the constituting layers of each structure are sequentially stacked from an emission layer in the stated order.

The electron transport region may include a metal oxide, and a metal of the metal oxide may include Zn, Ti, Zr, Sn, W, Ta, Ni, Mo, Cu, Mg, Co, Mn, Y, Al, or a combination thereof. Also, the electron transport region may include a metal sulfide, such as CuSCN or the like.

The electron transport region (for example, an electron injection layer or an electron transport layer included in the electron transport region) may include a metal oxide represented by Formula 3:

$$M_pO_q \quad \text{Formula 3}$$

wherein, in Formula 3,

M may be Zn, Ti, Zr, Sn, W, Ta, Ni, Mo, Cu, V, or a combination thereof, and p and q may each independently be an integer from 1 to 5.

The metal oxide may be represented by Formula 3-1:

$$Zn_{(1-r)}M'_rO \quad \text{Formula 3-1}$$

wherein, in Formula 3-1,

M' may be Mg, Co, Ni, Zr, Mn, Sn, Y, Al, or a combination thereof, and r may be a number greater than 0 and equal to or less than 0.5.

In one or more embodiments, the electron transport region may include at least one of ZnO or ZnMgO.

The electron transport region may include, for example, ZnO, $TiO_2$, $WO_3$, $SnO_2$, $In_2O_3$, $Nb_2O_5$, $Fe_2O_3$, $CeO_2$, $SrTiO_3$, $Zn_2SnO_4$, $BaSnO_3$, $In_2S_3$, ZnSiO, [6,6]-phenyl-$C_{60}$-butyric acid methyl ester (PC60BM), [6,6]-phenyl-$C_{70}$-butyric acid methyl ester (PC70BM), ZnMgO, aluminum zinc oxide (AZO), gallium doped zinc oxide (GZO), indium zinc oxide (IZO), Al-doped $TiO_2$, Ga-doped $TiO_2$, In-doped $TiO_2$, Al-doped $WO_3$, Ga-doped $WO_3$, In-doped $WO_3$, Al-doped $SnO_2$, Ga-doped $SnO_2$, In-doped $SnO_2$, Mg-doped $In_2O_3$, Al-doped $In_2O_3$, Ga-doped $In_2O_3$, Mg-doped $Nb_2O_5$, Al-doped $Nb_2O_5$, Ga-doped $Nb_2O_5$, Mg-doped $Fe_2O_3$, Al-doped $Fe_2O_3$, Ga-doped $Fe_2O_3$, In-doped $Fe_2O_3$, Mg-doped $CeO_2$, Al-doped $CeO_2$, Ga-doped $CeO_2$, In-doped $CeO_2$, Mg-doped $SrTiO_3$, Al-doped $SrTiO_3$, Ga-doped $SrTiO_3$, In-doped $SrTiO_3$, Mg-doped $Zn_2SnO_4$, Al-doped $Zn_2SnO_4$, Ga-doped $Zn_2SnO_4$, In-doped $Zn_2SnO_4$, Mg-doped $BaSnO_3$, Al-doped $BaSnO_3$, Ga-doped $BaSnO_3$, In-doped $BaSnO_3$, Mg-doped $In_2S_3$, Al-doped $In_2S_3$, Ga-doped $In_2S_3$, In-doped $In_2S_3$, Mg-doped ZnSiO, Al-doped ZnSiO, Ga-doped ZnSiO, In-doped ZnSiO, or the like, or a combination thereof.

In one or more embodiments, the electron transport region (for example, the buffer layer, the hole blocking layer, the electron control layer, or the electron transport layer in the electron transport region) may include a metal-free compound including at least one rr electron-deficient nitrogen-containing $C_1$-$C_{60}$ cyclic group.

In one or more embodiments, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

For example, the electron transport region may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, $-P(Q_{601})(Q_{602})$, or $-P(=O)(Q_{601})(Q_{602})$, $Q_{601}$ to $Q_{603}$ may each be as described herein with respect to $Q_1$, xe21 may be 1, 2, 3, 4, or 5, at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked to each other via a single bond.

In other embodiments, $Ar_{601}$ in Formula 601 may be a substituted or unsubstituted anthracene group.

In other embodiments, the electron transport region may include a compound represented by Formula 601-1:

[Formula 601-1]

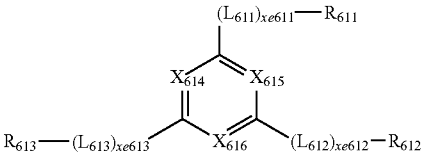

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each be as described herein with respect to $L_{601}$, xe611 to xe613 may each be as described herein with respect to xe1, $R_{611}$ to $R_{613}$ may each be as described herein with respect to $R_{601}$, and $R_{614}$ to $R_{616}$ may each independently be hydrogen, deuterium, —F, —Cl, —Br, —I, $-SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{60}$ alkylthio group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include at least one of Compounds ET1 to ET45, 2,9-dimethyl-4,7-diphenyl-1,10-phenanthroline (BCP), 4,7-diphenyl-1,10-phenanthroline (Bphen), tris(8-hydroxy-quinolinato)aluminum ($Alq_3$), bis(2-methyl-8-quinolinolato-N1,O8)-(1,1'-biphenyl-4-olato) aluminum (BAlq), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), or a combination thereof:

ET1

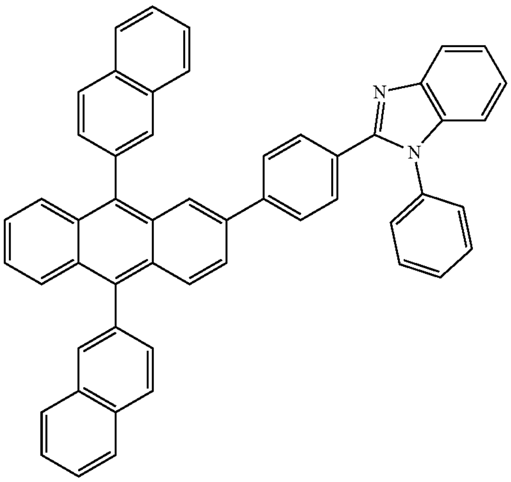

ET2

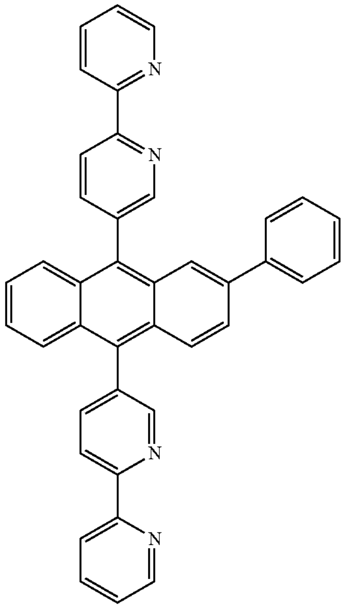

ET3

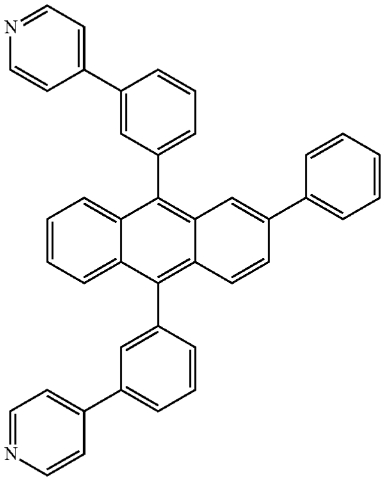

-continued
ET4
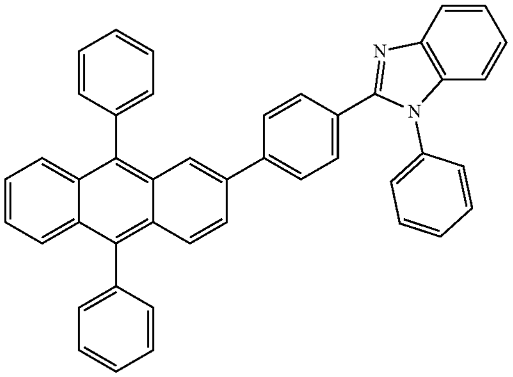
ET5
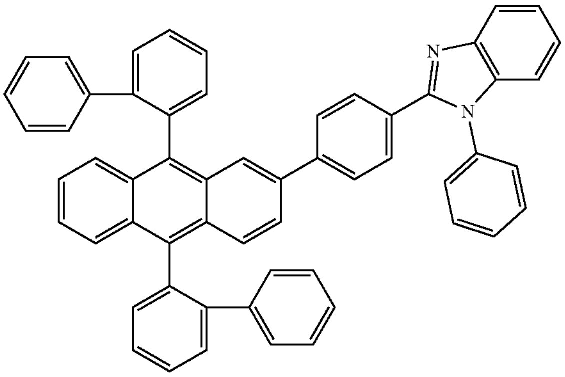
ET6
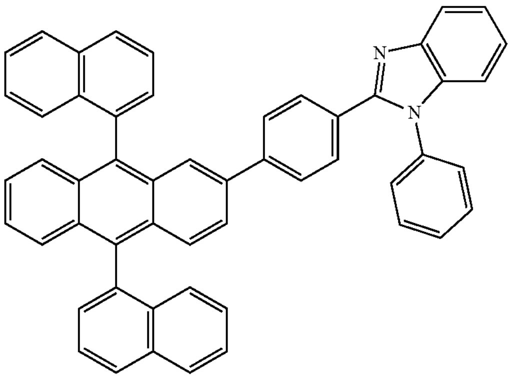
-continued
ET7
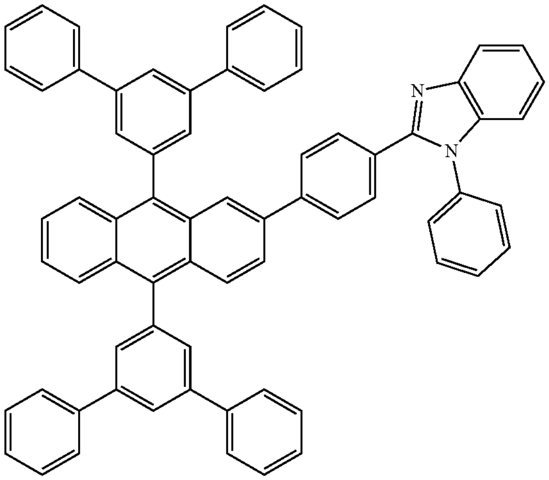
ET8
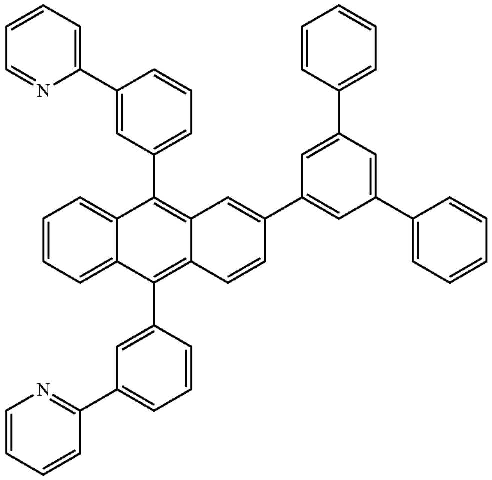
ET9
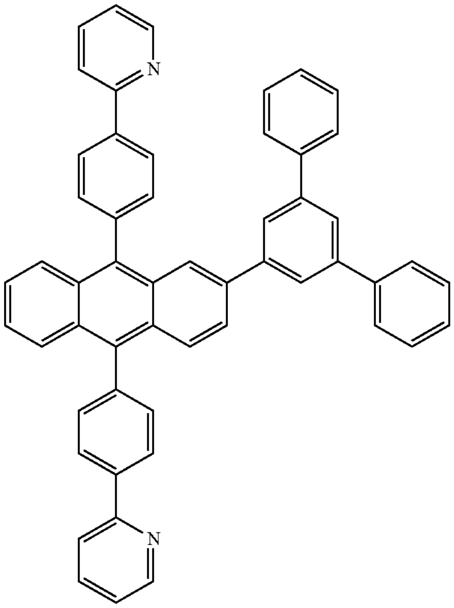

-continued
ET10
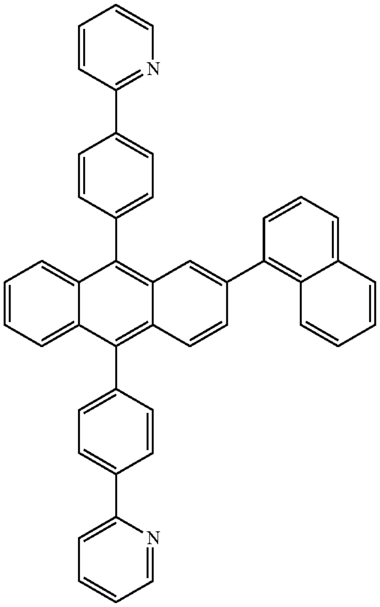
ET11
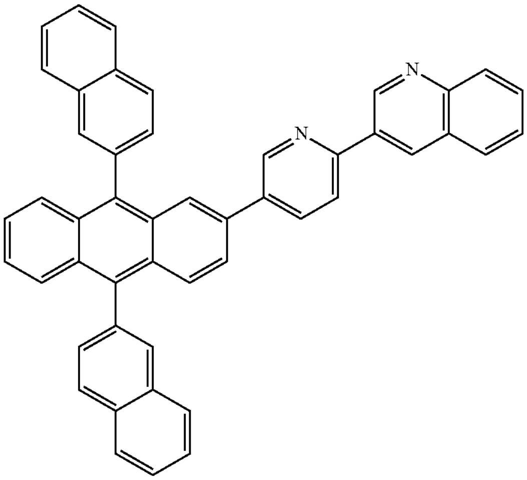
ET12
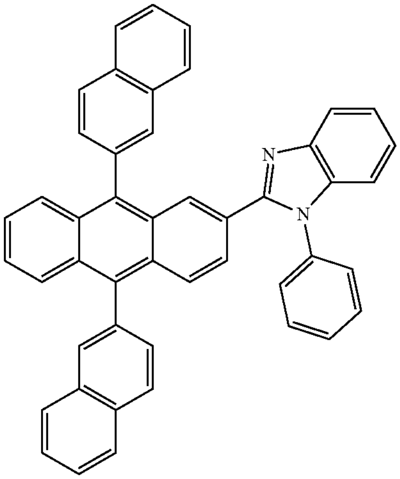
-continued
ET13
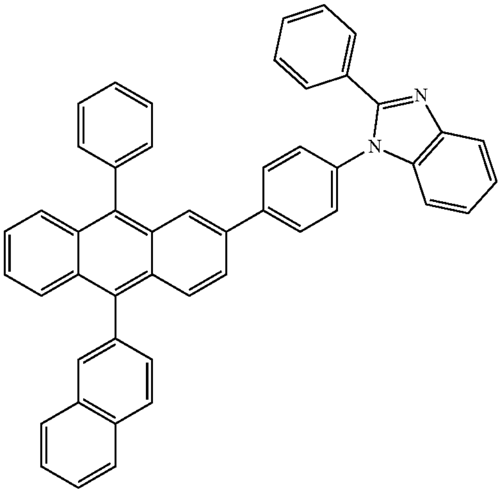
ET14
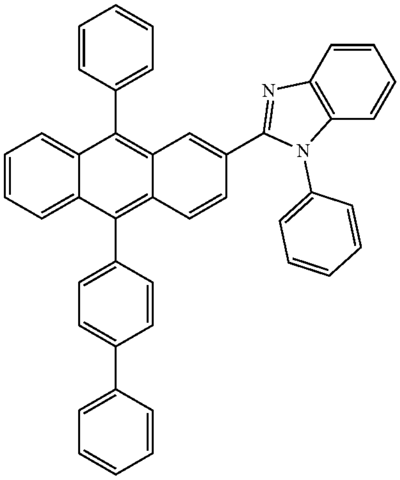
ET15
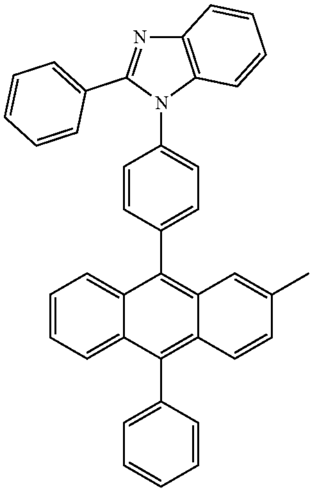

-continued
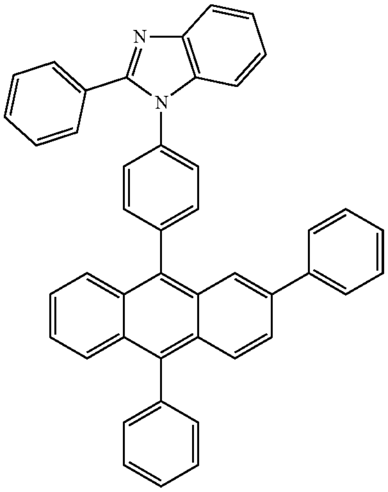
ET16
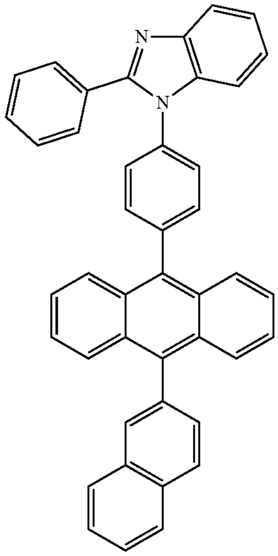
ET17
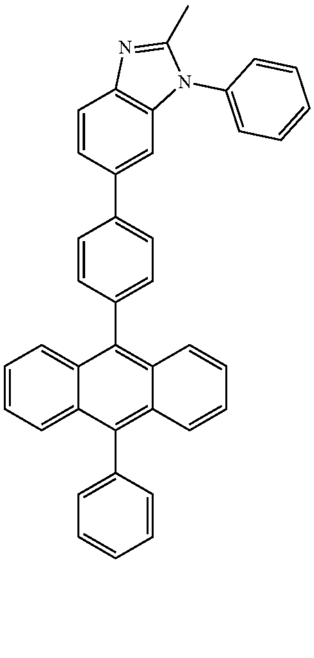
ET18
-continued
ET19
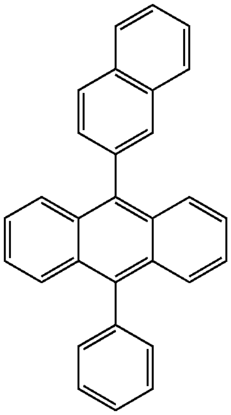
ET20
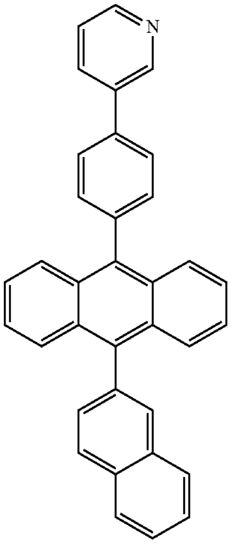
ET21
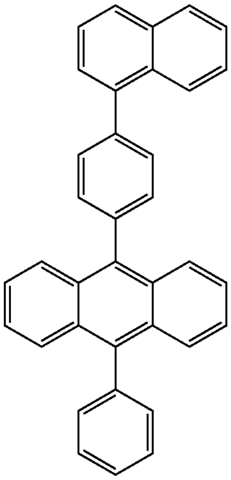

-continued
ET22
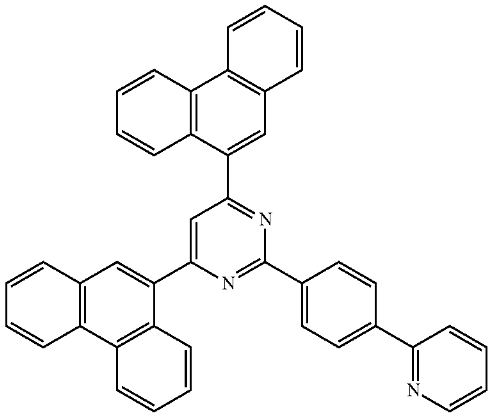
ET23
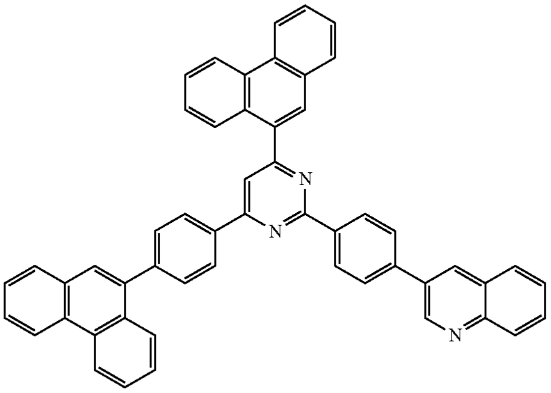
ET24
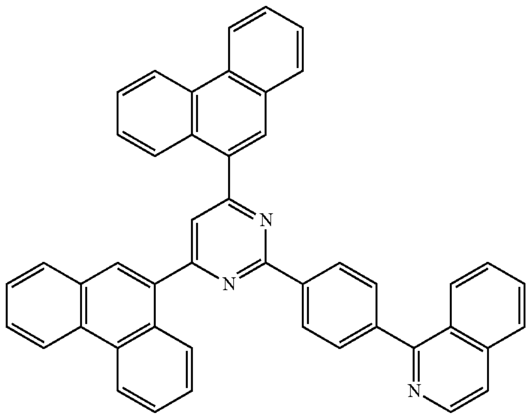
-continued
ET25
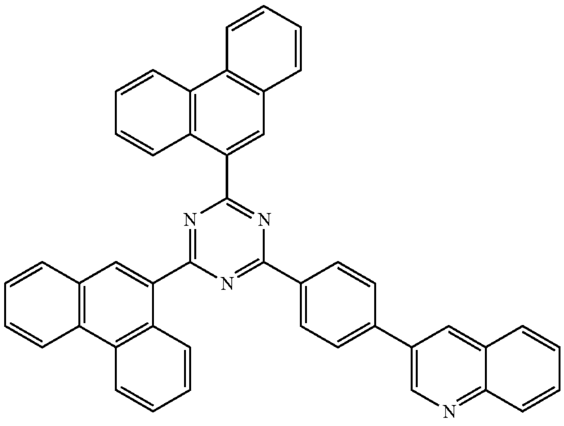
ET26
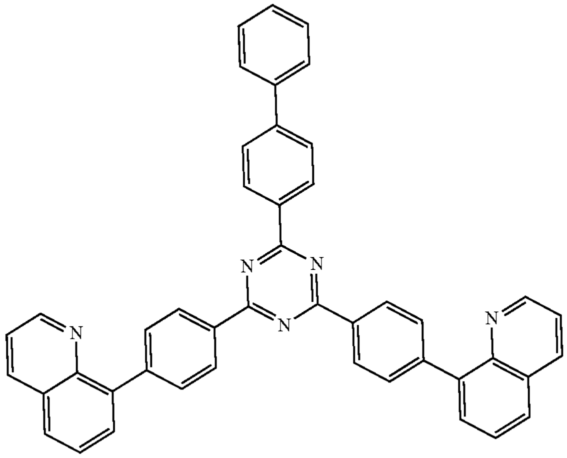
ET27
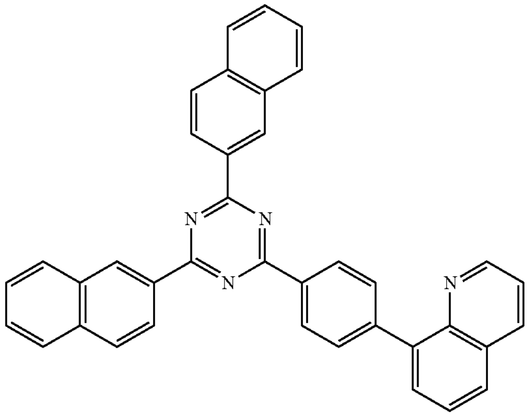

-continued
ET28
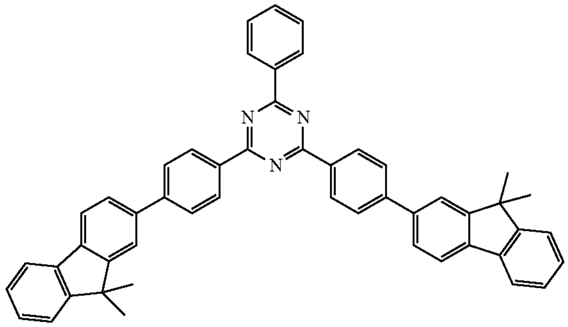
ET29
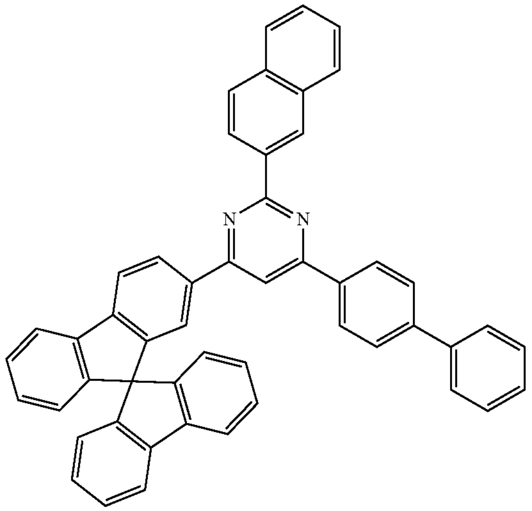
ET30
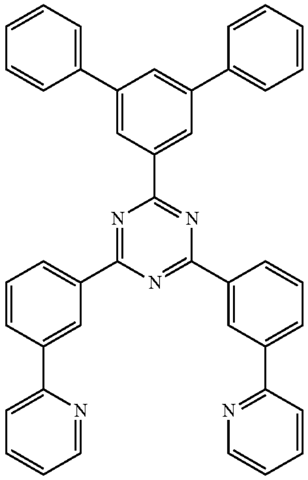
-continued
ET31
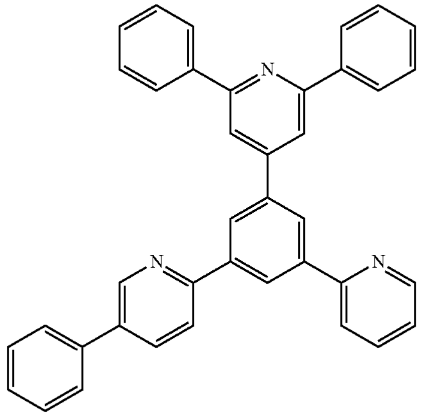
ET32
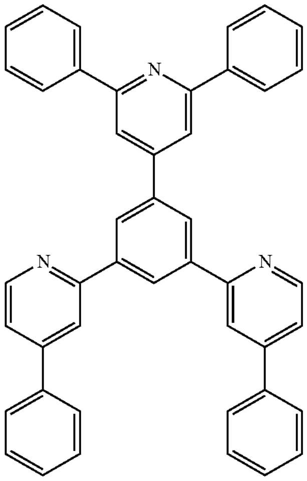
ET33
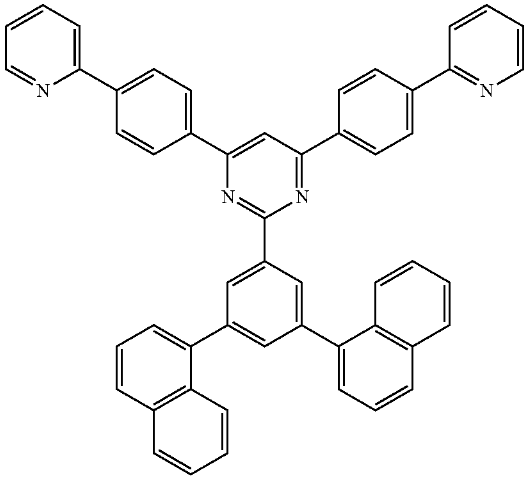

-continued
ET34
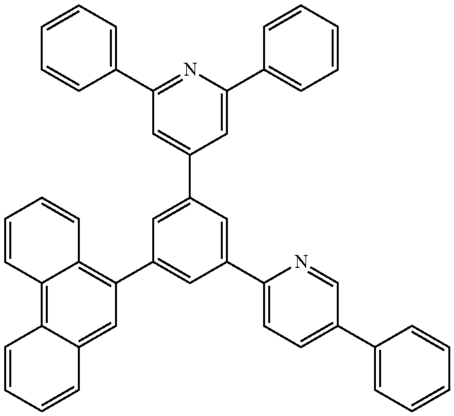
ET35
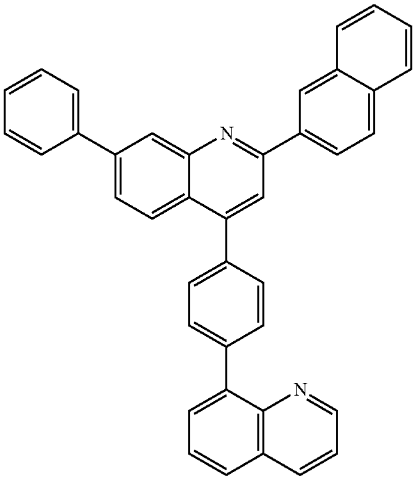
ET36
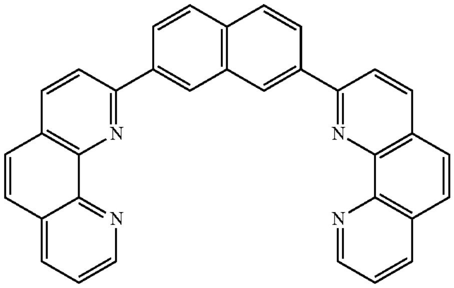
ET37
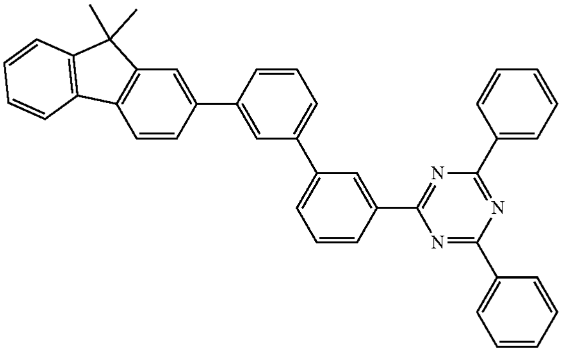
-continued
ET38
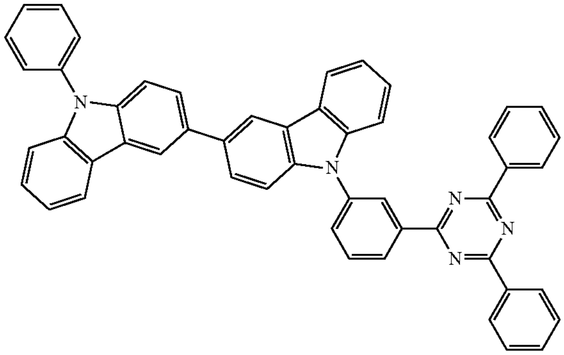
ET39
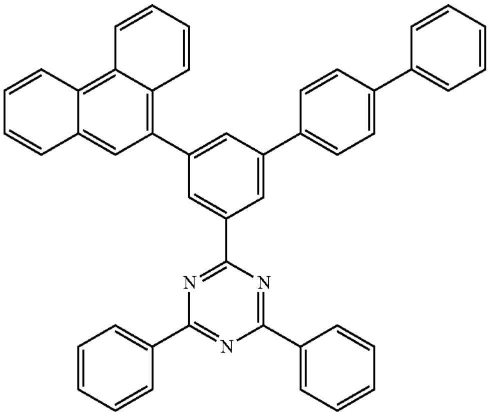
ET40
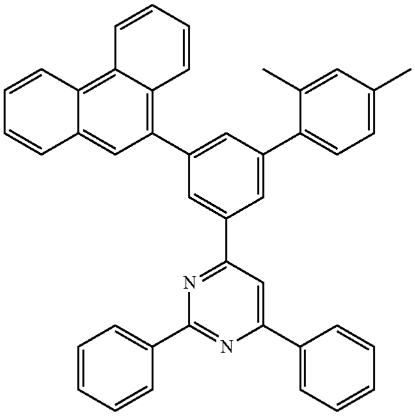

-continued
ET41
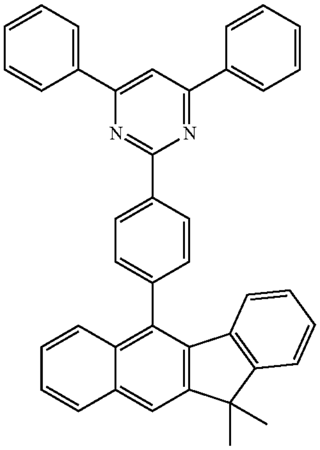
ET42
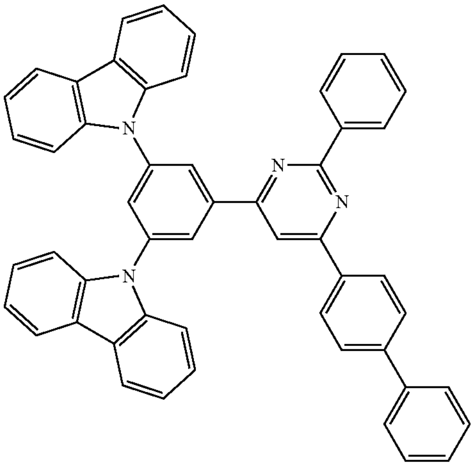
ET43
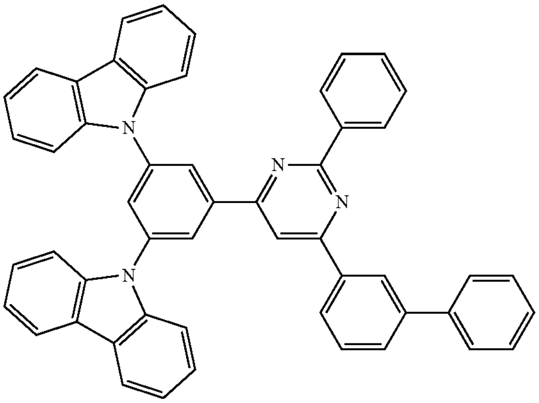
-continued
ET44
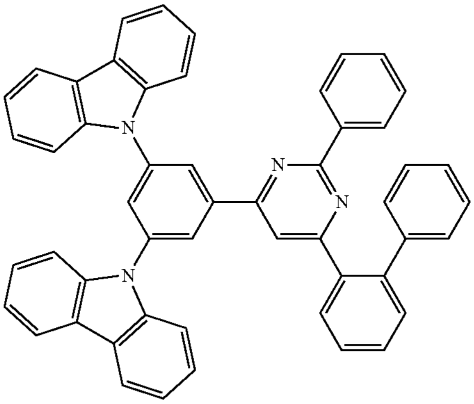
ET45
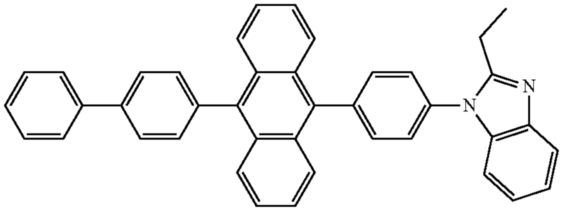
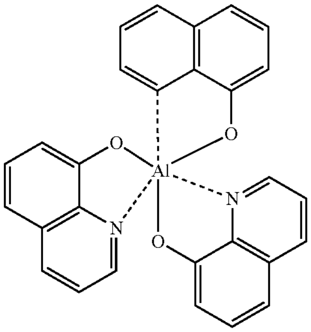
Alq$_3$
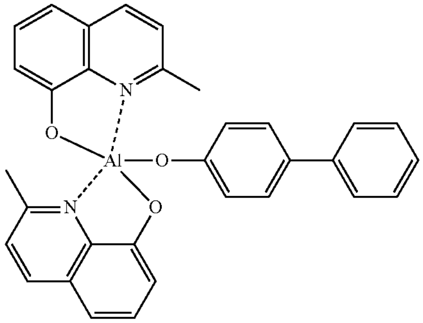
BAlq
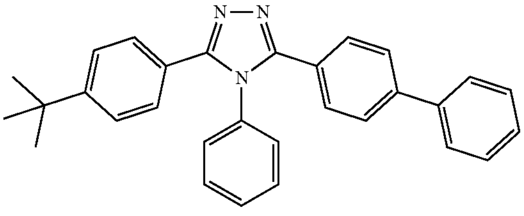
TAZ -continued

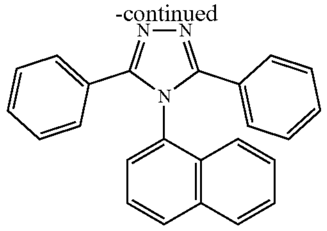

NTAZ

A thickness of the electron transport region may be from about 100 Å to about 5,000 Å, for example, about 160 Å to about 4,000 Å. When the electron transport region includes a buffer layer, a hole blocking layer, an electron control layer, an electron transport layer, or a combination thereof, the thickness of the buffer layer, the hole blocking layer, or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thickness of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or a combination thereof. The metal ion of an alkali metal complex may be a Li ion, a Na ion, a K ion, a Rb ion, a Cs ion, or a combination thereof, and the metal ion of an alkaline earth metal complex may be a Be ion, a Mg ion, a Ca ion, a Sr ion, a Ba ion, or a combination thereof.

The ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or a combination thereof.

For example, the metal-containing material may include a Li complex. The Li complex may include, for example, at least one of Compound ET-D1 (LiQ) or ET-D2:

ET-D1

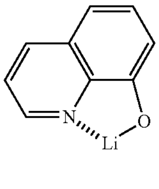

-continued

ET-D2

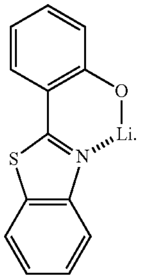

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, an alkaline earth metal complex, a rare earth metal complex, or a combination thereof.

The alkali metal may include Li, Na, K, Rb, Cs, or a combination thereof. The alkaline earth metal may include Mg, Ca, Sr, Ba, or a combination thereof. The rare earth metal may include Sc, Y, Ce, Tb, Yb, Gd, or a combination thereof.

The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or a combination thereof.

The alkali metal-containing compound may include an alkali metal oxide, such as $Li_2O$, $Cs_2O$, $K_2O$, or the like, or a combination thereof; an alkali metal halide, such as LiF, NaF, CsF, KF, LiI, NaI, CsI, KI, or the like, or a combination thereof. The alkaline earth metal-containing compound may include an alkaline earth metal compound, such as BaO, SrO, CaO, $Ba_xSr_{1-x}O$ (wherein x is a real number satisfying the condition of $0<x<1$), $Ba_xCa_{1-x}O$ (wherein x is a real number satisfying the condition of $0<x<1$), or the like, or a combination thereof. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or the like, or a combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, or the like, or a combination thereof.

The alkali metal complex, the alkaline earth-metal complex, and the rare earth metal complex may include i) one of ions of the alkali metal, the alkaline earth metal, or the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or a combination thereof.

The electron injection layer may comprise or may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or a combination thereof, as described herein. In one or more embodiments, the electron injection layer may further include an organic material (for example, a compound represented by Formula 601).

In one or more embodiments, the electron injection layer may comprise or may consist of: i) an alkali metal-containing compound (for example, an alkali metal halide); or ii) a) an alkali metal-containing compound (for example, an alkali metal halide), and b) an alkali metal, an alkaline earth metal, a rare earth metal, or a combination thereof. For example, the electron injection layer may be a KI:Yb co-deposited layer, an RbI:Yb co-deposited layer, a LiF:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or a combination thereof may be uniformly or non-uniformly dispersed in a matrix including the organic material.

The thickness of the electron injection layer may be in a range of about 1 Å to about 100 Å, and, for example, about 3 Å to about 90 Å. When the thickness of the electron injection layer is within the ranges described herein, satisfactory electron injection characteristics may be obtained without a substantial increase in driving voltage.

Second Electrode 150

The second electrode 150 may be located on the interlayer 130 having a structure as described herein. The second electrode 150 may be a cathode, which is an electron injection electrode, and as the material for the second electrode 150, a metal, an alloy, an electrically conductive compound, or a combination thereof, each having a low-work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including a plurality of layers.

Capping Layer

A first capping layer may be located outside the first electrode 110, and/or a second capping layer may be located outside the second electrode 150. In particular, the light-emitting device 10 may have a structure wherein the first capping layer, the first electrode 110, the interlayer 130, and the second electrode 150 are sequentially stacked in the stated order, a structure wherein the first electrode 110, the interlayer 130, the second electrode 150, and the second capping layer are sequentially stacked in the stated order, or a structure wherein the first capping layer, the first electrode 110, the interlayer 130, the second electrode 150, and the second capping layer are sequentially stacked in the stated order.

Light generated in an emission layer of the interlayer 130 of the light-emitting device 10 may be extracted toward the outside through the first electrode 110, which may be a semi-transmissive electrode or a transmissive electrode, and the first capping layer. Light generated in an emission layer of the interlayer 130 of the light-emitting device 10 may be extracted toward the outside through the second electrode 150, which may be a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 may be increased, so that the luminescence efficiency of the light-emitting device 10 may be improved.

Each of the first capping layer and the second capping layer may include a material having a refractive index of about 1.6 or greater (at 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include a carbocyclic compound, a heterocyclic compound, an amine group-containing compound, a porphine derivatives, a phthalocyanine derivative, a naphthalocyanine derivative, an alkali metal complex, an alkaline earth metal complex, or a combination thereof. Optionally, the carbocyclic compound, the heterocyclic compound, and the amine group-containing compound may be substituted with a substituent including at least one of O, N, S, Se, Si, F, Cl, Br, I, or a combination thereof. In one or more embodiments, at least one of the first capping layer and the second capping layer may each independently include an amine group-containing compound.

For example, at least one of the first capping layer and the second capping layer may each independently include a compound represented by Formula 201, a compound represented by Formula 202, or a combination thereof.

In one or more embodiments, at least one of the first capping layer and the second capping layer may each independently include at least one of Compounds HT28 to HT33, one of Compounds CP1 to CP6, β-N,N'-di(1-naphthyl)-N,N'-diphenylbenzidine (β-NPB), or a combination thereof:

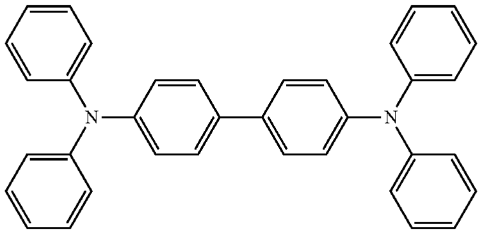
CP1
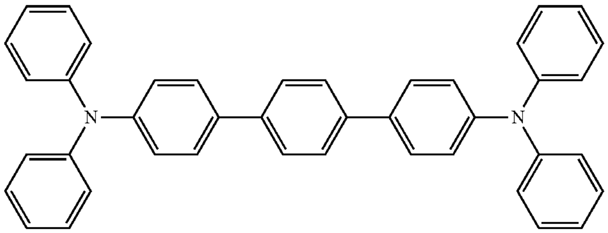
CP2
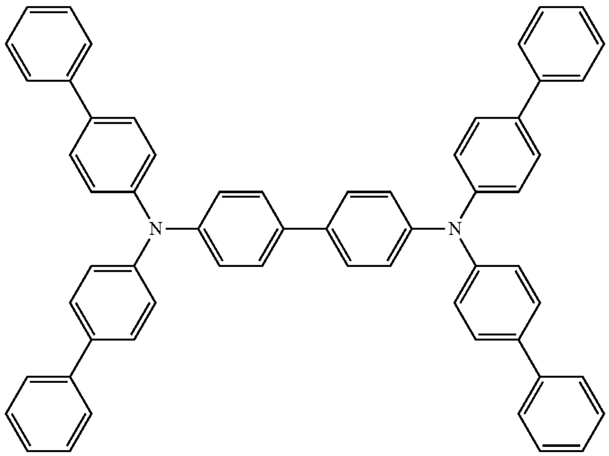
CP3
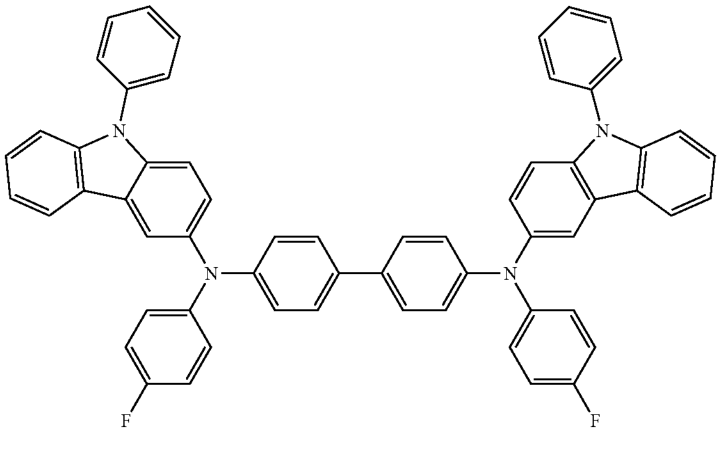
CP4

-continued

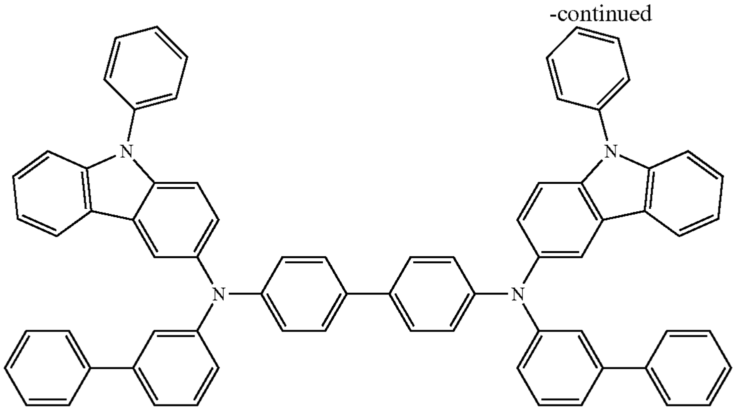

CP5

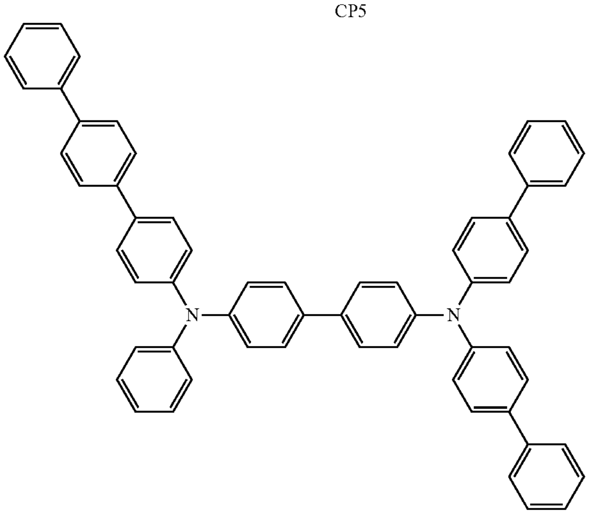

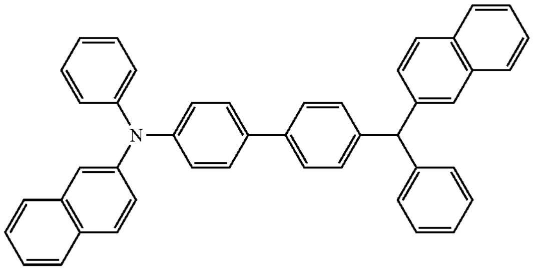.

CP6

β-NPB

Electronic Apparatus

The light-emitting device may be included in various electronic apparatuses. For example, the electronic apparatus including the light-emitting device may be a light-emitting apparatus, an authentication apparatus, or the like.

The electronic apparatus (for example, a light-emitting apparatus) may further include, in addition to the light-emitting device, i) a color filter, ii) a color conversion layer, and/or iii) a color filter and a color conversion layer. The color filter and/or the color conversion layer may be located in at least one traveling direction of light emitted from the light-emitting device. For example, the light emitted from the light-emitting device may be a blue light or a white light. For details on the light-emitting device, related description provided herein may be referred to. In one or more embodiments, the color conversion layer may include a quantum dot. The quantum dot may be, for example, a quantum dot as described herein.

The electronic apparatus may include a first substrate. The first substrate may include a plurality of subpixel areas, the color filter may include a plurality of color filter areas respectively corresponding to each of the subpixel areas, and the color conversion layer may include a plurality of color conversion areas respectively corresponding to each of the subpixel areas.

A pixel-defining film may be located among or within the subpixel areas to define each of the subpixel areas.

The color filter may further include a plurality of color filter areas and light-shielding patterns located among or within the color filter areas, and the color conversion layer may further include a plurality of color conversion areas and light-shielding patterns located among or within the color conversion areas.

The plurality of color filter areas (or the plurality of color conversion areas) may include a first area emitting a first color light, a second area emitting a second color light, and/or a third area emitting a third color light, wherein the first color light, the second color light, and/or the third color light may have different maximum emission wavelengths from one another. For example, the first color light may be a red light, the second color light may be a green light, and the third color light may be a blue light. For example, a plurality of color filter areas (or the plurality of color conversion areas) may include quantum dots.

In particular, the first area may include a red quantum dot, the second area may include a green quantum dot, and the third area may not include a quantum dot. For details on the quantum dot, related descriptions provided herein may be referred to. The first area, the second area, and/or the third area may each include a light scatterer.

For example, the light-emitting device may emit first light, the first area may absorb the first light to emit a first-first color light, the second area may absorb the first light to emit a second-first color light, and the third area may absorb the first light to emit a third-first color light. In this regard, the first-first color light, the second-first color light, and the third-first color light may each have different maximum emission wavelengths. In particular, the first light may be a blue light, the first-first color light may be a red light, the second-first color light may be a green light, and the third-first color light may be a blue light.

The electronic apparatus may further include a thin-film transistor, in addition to the light-emitting device as described herein. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulating film, or the like, or a combination thereof.

The activation layer may include crystalline silicon, amorphous silicon, an organic semiconductor, an oxide semiconductor, or the like, or a combination thereof.

The electronic apparatus may further include a sealing portion for sealing the light-emitting device. The sealing portion may be located between the color filter and/or the color conversion layer and the light-emitting device. The sealing portion may allow at least a portion of the light from the light-emitting device to be extracted to the outside, and simultaneously may prevent or significantly prevent ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touch screen layer, a polarizing layer, and the like. The touch screen layer may be a pressure-sensitive touch screen layer, a capacitive touch screen layer, or an infrared touch screen layer.

The authentication apparatus may further include, in addition to the light-emitting device as described above, a biometric information collector. The authentication apparatus may be, for example, a biometric authentication apparatus that authenticates an individual by using biometric information of a living body (for example, fingertips, pupils, or the like).

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, or the like.

Figure 2:
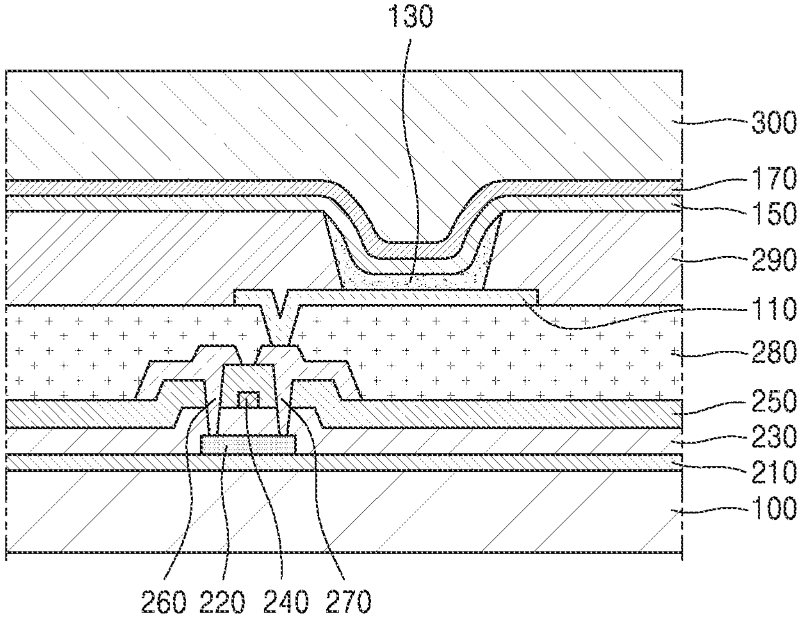
FIG. 2 is a schematic view of an electronic apparatus according to one or more embodiments.
Figure 3:
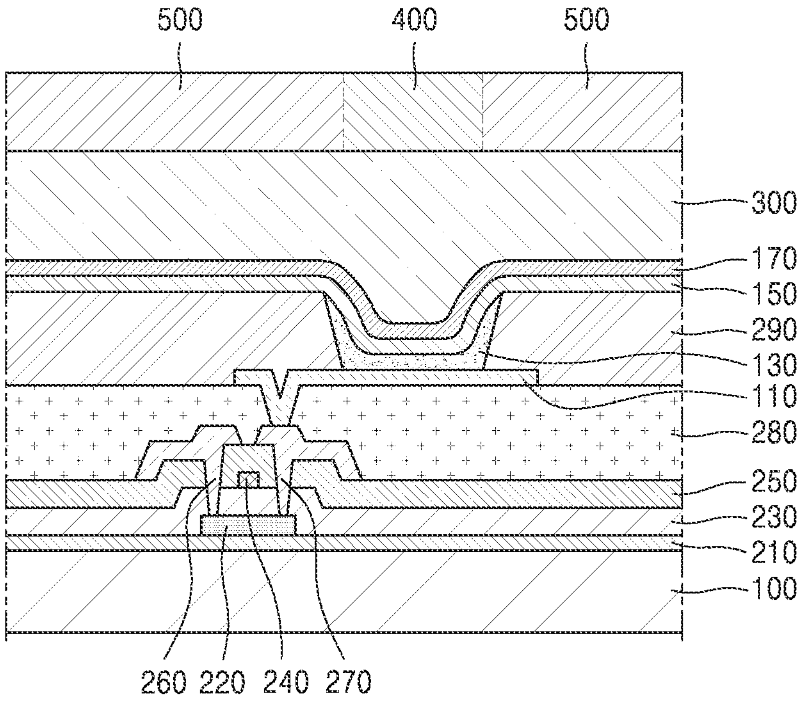
FIG. 3 is a schematic view of an electronic apparatus according to one or more embodiments.

Descriptions of FIGS. 2 and 3

FIG. 2 is a cross-sectional view showing a light-emitting apparatus according to one or more embodiments.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be located between the gate electrode 240 and the source electrode 260 and between the gate electrode 240 and the drain electrode 270, to insulate from one another.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located in contact with the exposed portions of the source region and the drain region of the activation layer 220.

The TFT is electrically connected to a light-emitting device to drive the light-emitting device, and is covered and protected by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be located on the passivation layer 280. The passivation layer 280 may be located to expose a portion of the drain electrode 270, not fully covering the drain electrode 270, and the first electrode 110 may be located to be connected to the exposed portion of the drain electrode 270.

A pixel defining layer 290 including an insulating material may be located on the first electrode 110. The pixel defining layer 290 may expose a certain region of the first electrode 110, and an interlayer 130 may be formed in the exposed region of the first electrode 110. The pixel defining layer 290 may be a polyimide or poly(meth)acrylate organic film. Although not shown in FIG. 2, at least some layers of the interlayer 130 may extend to the upper portion of the pixel defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture or oxygen. The encapsulation portion 300 may include: an inorganic film including a silicon nitride (SiNx), a silicon oxide (SiOx), an indium tin oxide, an indium zinc oxide, or a combination thereof; an organic film including polyethylene terephthalate, polyethylene naphthalate, a polycarbonate, a polyimide, a polyethylene sulfonate, a polyoxymethylene, a polyarylate, hexamethyldisiloxane, a (meth)acrylic resin (for example, polymethyl methacrylate, polyacrylic acid, or the like), an epoxy-containing resin (for example, aliphatic glycidyl ether (AGE), or the like), or a combination thereof; or a combination of the inorganic film(s) and the organic film(s).

FIG. 3 shows a cross-sectional view showing a light-emitting apparatus according to one or more embodiments.

The light-emitting apparatus of FIG. 3 is described for the light-emitting apparatus of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

Manufacturing Method

The layers included in the hole transport region, the emission layer, and the layers included in the electron transport region may be formed in a certain region by using various methods such as vacuum deposition, spin coating, casting, Langmuir-Blodgett (LB) deposition, ink-jet printing, laser-printing, laser-induced thermal imaging, and the like. For example, the emission layer may be formed by inkjet printing.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 angstroms per second (Å/sec) to about 100 Å/sec, depending on a material to be included in a layer to be formed and the structure of a layer to be formed.

DEFINITION OF TERMS

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, at least one heteroatom selected from N, O, Si, P, Ge, Se, and S as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, or the like), the π electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group condensed to any cyclic group, a monovalent group, or a polyvalent group (for example, a divalent group, a trivalent group, a tetravalent group, or the like) according to the structure of a formula for which the corresponding term is used. For example, the "phenyl group" or the "benzene group" may be a benzo group, a phenyl group, a phenylene group, or the like, which may be easily understood by one of ordinary skill in the art according to the structure of a formula including the "phenyl group" or the "benzene group."

Non-limiting examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

Non-limiting examples of the divalent $C_3$-$C_{60}$ carbocyclic group and the monovalent $C_1$-$C_6$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and specific non-limiting examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and non-limiting examples thereof are an ethenyl group, a propenyl group, and a butenyl group.

The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and non-limiting examples thereof are an ethynyl group, a propynyl group, and the like. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_1$-$C_{60}$ alkylthio group" as used herein refers to a monovalent group represented by —$SA_{101}$ (wherein $A_{101}$ is the $C_1$-$C_{60}$ alkyl group).

The term "$C_3$-$C_{10}$ cycloalkyl group" as used herein refers to a monovalent saturated hydrocarbon cyclic group having 3 to 10 carbon atoms, and non-limiting examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group of 1 to 10 carbon atoms, further including, in addition to carbon atoms, at least one heteroatom selected from N, O, Si, P, Ge, Se, and S, as ring-forming atoms, and specific non-limiting examples are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has three to ten carbon atoms and at least one carbon-carbon double bond in the ring thereof and no aromaticity, and specific non-limiting examples thereof are a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group of 1 to 10 carbon atoms, further including, in addition to carbon atoms, at least one heteroatom selected from N, O, Si, P, Ge, Se, and S, as ring-forming atoms, and having at least one carbon-carbon double bond in the cyclic structure thereof. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system of 6 to 60 carbon atoms, and the term "$C_6$-$C_{60}$ arylene group" as used herein refers to a divalent group having a carbocyclic aromatic system of 6 to 60 carbon atoms. Non-limiting examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein refers to a monovalent group having a heterocyclic aromatic system of 1 to 60 carbon atoms, further including, in addition to carbon atoms, at least one heteroatom selected from N, O, Si, P, Ge, Se, and S, as ring-forming atoms. The term "$C_1$-$C_{60}$ heteroarylene group" as used herein refers to a divalent $C_1$-$C_{60}$ heteroaryl group. Non-limiting examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Non-limiting examples of the monovalent non-aromatic condensed polycyclic group are an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having the same structure as the monovalent non-aromatic condensed polycyclic group described herein.

The term "monovalent non-aromatic condensed heteropolycyclic group" as used herein refers to a monovalent group (for example, having 1 to 60 carbon atoms) having two or more rings condensed to each other, further including, in addition to carbon atoms, at least one heteroatom selected from N, O, Si, P, Ge, Se, and S, as ring-forming atoms, and having no aromaticity in its entire molecular structure. Non-limiting examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group described herein.

The term "$C_6$-$C_{60}$ aryloxy group" as used herein indicates —$OA_{102}$ (wherein $A_{102}$ is a $C_6$-$C_{60}$ aryl group), and the term "$C_6$-$C_{60}$ arylthio group" as used herein indicates —$SA_{103}$ (wherein $A_{103}$ is a $C_6$-$C_{60}$ aryl group).

The term "$C_1$-$C_{60}$ heteroaryloxy group" as used herein indicates —$OA_{102}'$ (wherein $A_{102}'$ is a $C_1$-$C_{60}$ heteroaryl group), and the term "$C_1$-$C_{60}$ heteroarylthio group" as used herein indicates —$SA_{103}'$ (wherein $A_{103}'$ is a $C_1$-$C_{60}$ heteroaryl group).

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$R_{10a}$" as used herein refers to:

deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or $C_1$-$C_{60}$ alkylthio group, each unsubstituted or substituted with at least one of deuterium, —F, —Cl, —Br, —I, $SF_5$, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_{60}$ heteroaryloxy group, a $C_1$-$C_{60}$ heteroarylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(Q_{11})(Q_{12})$, —$P(=O)(Q_{11})(Q_{12})$, or a combination thereof, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, a $C_1$-$C_6$ heteroaryloxy group, or a $C_1$-$C_{60}$ heteroarylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_6$ aryl alkyl group, a $C_2$-$C_{60}$ heteroaryl alkyl group, a $C_1$-$C_{60}$ heteroaryloxy group, a $C_1$-$C_6$ heteroarylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(Q_{21})(Q_{22})$, —$P(=O)(Q_{21})(Q_{22})$, or a combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(Q_{31})(Q_{32})$, or —$P(=O)(Q_{31})(Q_{32})$, wherein $Q_1$ to $Q_3$, $Q_{11}$ to $Q_{13}$, $Q_{21}$ to $Q_{23}$ and $Q_{31}$ to $Q_{33}$ as used herein may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

Unless otherwise defined herein, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted $C_3$-$C_{60}$ carbocyclic group, the substituted $C_1$-$C_{60}$ heterocyclic group, the substituted monovalent non-aromatic condensed polycyclic group, and the substituted monovalent non-aromatic condensed heteropolycyclic group may be:

deuterium, —F, —Cl, —Br, —I, —$SF_5$,—$CD_3$,—$CD_2H$,—$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$,—$CD_3$,—$CD_2H$,—$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_6$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$C(=O)(Q_{11})$, —$S(=O)_2(Q_{11})$, —$Si(Q_{13})(Q_{14})$(015), —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —$SF_5$,—$CD_3$,—$CD_2H$,—$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_6$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$C(=O)(Q_{21})$, —$S(=O)_2(Q_{21})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof, —$N(Q_{31})(Q_{32})$, —$C(=O)(Q_{31})$, —$S(=O)_2(Q_{31})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$, or a combination thereof, wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

The term "heteroatom" as used herein refers to any atom other than a carbon atom. Examples of the heteroatom are O, S, N, P, Si, B, Ge, Se, or a combination thereof.

The term "Ph" as used herein refers to a phenyl group, "Me" as used herein refers to a methyl group, "Et" as used herein refers to an ethyl group, "tert-Bu" or "$Bu^t$" as used herein refers to a tert-butyl group, and "0Me" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, compounds according to embodiments and light-emitting devices according to embodiments will be described in detail with reference to the following synthesis examples and examples. The wording "B was used instead of A" used in describing Synthesis Examples means that an identical molar equivalent of B was used in place of A.

EXAMPLES

Synthesis Example 1. Manufacture of ZnSeTe/ZnSe Quantum Dot 2 millimoles (mmol) of zinc acetate, 2 milliliters (mL) of oleic acid (OA), and 15 mL of 1-octadecene (ODE) were charged into a 3-neck flask, and, while a vacuum was applied at 120° C., were allowed to dissolve transparently. Subsequently, selenium diphenylphosphine (Se-DPP) (1 mmol of Se in 0.5 mL of diphenylphosphine (DPP)) and tellurium trioctylphosphine (Te-TOP) (0.349 mmol of Te in 0.8 ml of trioctylphosphine (TOP)) were sequentially injected thereto at 220° C., and the reaction mixture was maintained for 30 minutes. The reaction mixture was then heated at 300° C. for 1 hour. Then, the temperature was allowed lower to room temperature, and ethanol (EtOH) was added in an excess amount and a product was precipitated, and then the precipitated product was dispersed in hexane.

3 mmol of zinc acetate, 2 mL of OA, and 10 mL of trioctylamine (TOA) were charged into a 3-neck flask, and, while under a vacuum at 120° C., were allowed to dissolve transparently. Subsequently, the synthesized ZnSeTe core was injected to the mixture, a vacuum was held for 5 minutes, HF was injected thereto, and a vacuum was held for an additional 10 minutes. The solution temperature was then increased to 240° C., 4 mL (0.5 molar (M)) of zinc oleate and 0.6 mL (2 M) of Se-TOP were injected into the mixture, and the temperature was then increased to 340° C. to grow a ZnSe shell.

Synthesis Example 2. Manufacture of ZnSeTe/ZnSe/ZnS Quantum Dot

After synthesizing ZnSeTe/ZnSe, 3 mL (0.5 M) of zinc oleate and 1.2 mL (2 M) of S-TOP were injected thereto, and then the mixture was reacted for 30 minutes to grow a ZnS shell.

The energy band gap of the quantum dots according to Synthesis Examples 1 and 2 and Zns quantum dot were measured, and the results are shown in Table 1.

TABLE 1

| Quantum dot | Energy band gap |
|---|---|
| ZnSeTe/ZnSe | 2.69 eV |
| ZnSeTe/ZnSe/ZnS | 2.73 eV |
| ZnS | 3.7 eV |

Example 1

A hole injection layer (poly(3,4-ethylenedioxythiophene): poly(styrenesulfonate) (PEDOT:PSS)), a hole transport layer (poly[(9,9-dioctylfluorenyl-2,7-diyl)-co-(4,4'-(N-(4-sec-butylphenyl)diphenylamine)](TFB)), a quantum dot emission layer, an electron transport layer (ZnMgO), and a cathode (Al) were sequentially stacked, thereby manufacturing a light-emitting device. The hole injection layer, the hole transport layer, the quantum dot emission layer, and the electron transport layer were each formed by spin coating and the cathode was formed by a deposition method, and the thicknesses of the hole injection layer, the hole transport layer, the quantum dot emission layer, and the electron transport layer were formed to be 1,400 Å, 400 Å, 200 Å, and 500 Å, respectively.

After forming the thin-film, the hole injection layer and the hole transport layer were subject to a VCD process at $10^{-3}$ torr and then baked at 230° C. for 30 minutes, and, after forming the thin-film, the quantum dot emission layer and the electron transport layer were subject to the VCD process at $10^{-3}$ torr and then baked at 100° C. for 10 minutes.

When forming the quantum dot emission layer, ZnSeTe/ZnSe/ZnS quantum dots and ZnSeTe/ZnSe quantum dots were used. Al was used for forming the cathode.

Comparative Example 1

A light-emitting device was manufactured in a similar manner as in Example 1 except that, when forming an emission layer, only ZnSeTe/ZnSe/ZnS quantum dots were used instead of using both ZnSeTe/ZnSe/ZnS quantum dots and ZnSeTe/ZnSe quantum dots.

Comparative Example 2

A light-emitting device was manufactured in a similar manner as in Example 1 except that, when forming an emission layer, ZnSeTe/ZnSe quantum dots and ZnS quantum dots (a weight ratio of 95:5) were used instead of using both ZnSeTe/ZnSe/ZnS quantum dots and ZnSeTe/ZnSe quantum dots.

Evaluation Example 1

The luminescence efficiency (EQE, %)) according to the luminance of the light-emitting devices of Example 1 and Comparative Examples 1 and 2 were measured, and the results are shown in Table 4. Power was supplied from a current-voltmeter (Keithley SMU 236), and the luminance and efficiency of the device were measured using a luminance meter (PR650).

Figure 4:
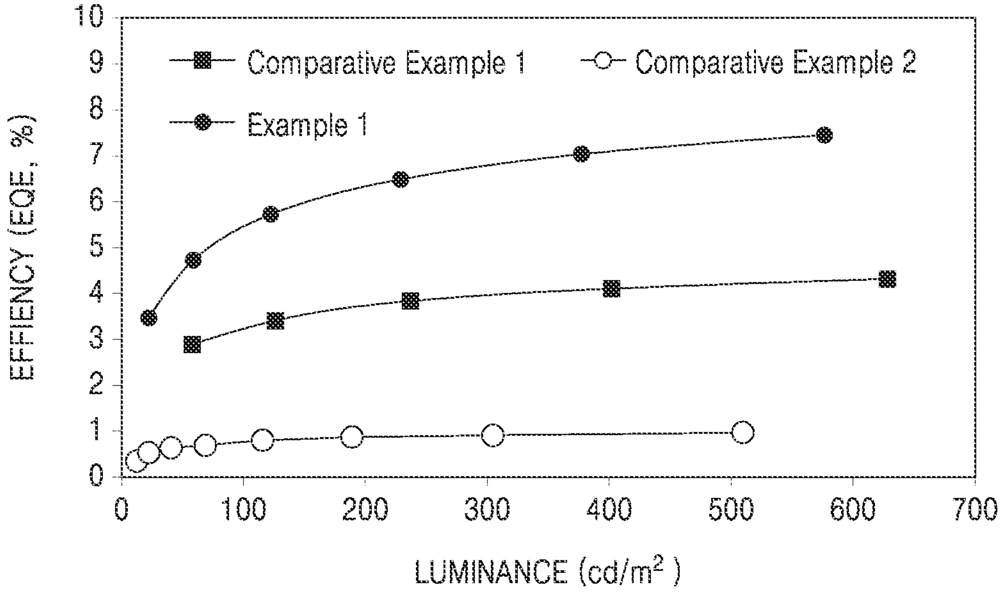
FIG. 4 is a graph of external quantum efficiency (EQE, %) versus luminance (candela per square meter, $cd/m^2$) and shows the luminescence efficiency according to the luminance of the light-emitting devices according to Example 1 and Comparative Examples 1 and 2.

Referring to FIG. 4, it was confirmed that the luminescence efficiency of the light-emitting device according to Example 1 was improved compared to that of the light-emitting devices according to Comparative Examples 1 and 2.

Because the light-emitting device includes an emission layer including two or more quantum dots having different energy band gaps, charge injection characteristics of the emission layer may be improved, thereby improving the luminescence efficiency of the light-emitting device.

It should be understood that the exemplary embodiments described herein should be considered in a descriptive sense and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A light-emitting device, comprising:

a first electrode;

a second electrode facing the first electrode; and an interlayer located between the first electrode and the second electrode, wherein the interlayer comprises an emission layer, and wherein the emission layer comprises a first quantum dot and a second quantum dot, wherein an energy band gap of the first quantum dot is greater than an energy band gap of the second quantum dot, wherein the first quantum dot emits light of a partial wavelength region of a visible light region, wherein the second quantum dot in the emission layer transfers holes or electrons to the first quantum dot in the emission layer, and wherein a luminescent component emitted from the second quantum dot is 10% or less of a total luminescent component emitted from the emission layer.

2. The light-emitting device of claim 1, wherein the energy band gap of the first quantum dot is about 2.8 electron volts or less.

3. The light-emitting device of claim 1, wherein a difference between the energy band gap of the first quantum dot and the energy band gap of the second quantum dot is about 0.01 electron volts or greater.

4. The light-emitting device of claim 1, wherein the first quantum dot and the second quantum dot each independently comprises a Group II-VI semiconductor compound, a Group III-V semiconductor compound, a Group III-VI semiconductor compound, a Group I-III-VI semiconductor compound, a Group IV-VI semiconductor compound, a Group IV element or compound, or a combination thereof.

5. The light-emitting device of claim 1, wherein the first quantum dot comprises a core and a shell, wherein the shell covers at least part of the core of the first quantum dot, and the second quantum dot comprises a core and optionally further comprises a shell, wherein the shell covers at least part of the core of the second quantum dot.

6. The light-emitting device of claim 5, wherein the core of the first quantum dot and the core of the second quantum dot each independently comprises: a Group II-VI semiconductor compound, a Group III-V semiconductor compound, or a combination thereof.

7. The light-emitting device of claim 5, wherein the core of the first quantum dot and the core of the second quantum dot each independently comprises CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

8. The light-emitting device of claim 5, wherein the shell of the first quantum dot and the shell of the second quantum dot each independently comprises CdS, CdSe, CdTe, ZnS, ZnSe, ZnTe, ZnO, ZnSeS, ZnTeS, GaAs, GaP, GaN, GaO, GaSb, HgS, HgSe, HgTe, InAs, InP, InS, InZnP, InZnS, InGaP, InGaN, InSb, AlAs, AlP, AlSb, PbS, TiO, SrSe, or a combination thereof.

9. The light-emitting device of claim 1, wherein the first quantum dot comprises a core and a shell, wherein the shell covers at least part of the core of the first quantum dot, and wherein the shell comprises two or more layers.

10. The light-emitting device of claim 1, wherein the first quantum dot comprises a core and a shell, wherein the shell covers at least part of the core of the first quantum dot, the shell of the first quantum dot comprises a first shell covering at least a part of the core of the first quantum dot, and a second shell covering at least a part of the first shell, the first shell and the second shell are different from each other, the second quantum dot comprises a core and optionally further comprises a shell, wherein the shell covers at least a part of the core of the second quantum dot, and the shell of the second quantum dot is a single layer.

11. The light-emitting device of claim 10, wherein a composition of the core of the first quantum dot is identical to a composition of the core of the second quantum dot, and a composition of the shell of the first quantum dot is identical to a composition of the shell of the second quantum dot.

12. The light-emitting device of claim 1, wherein the first quantum dot comprises a core, a first shell covering at least part of the core of the first quantum dot, and a second shell covering at least part of the first shell, the second quantum dot comprises a core, a first shell covering at least part of the core of the second quantum dot, and a second shell covering at least part of the first shell, and an average particle size of the core of the first quantum dot is different from an average particle size of the core of the second quantum dot.

13. The light-emitting device of claim 12, wherein an average particle size of the core of the first quantum dot is different from an average particle size of the core of the second quantum dot.

14. The light-emitting device of claim 1, wherein an amount by weight of the first quantum dot in the emission layer is greater than an amount by weight of the second quantum dot in the emission layer.

15. The light-emitting device of claim 1, wherein the first electrode is an anode, the second electrode is a cathode, the interlayer further includes a hole transport region located between the first electrode and the emission layer, and an electron transport region located between the emission layer and the second electrode, the hole transport region comprises a hole injection layer, a hole transport layer, an emission auxiliary layer, an electron blocking layer, or a combination thereof, and the electron transport region comprises a hole blocking layer, an electron transport layer, an electron injection layer, or a combination thereof.

16. The light-emitting device of claim 15, wherein the electron transport region comprises the electron transport layer, and the electron transport layer comprises a metal oxide represented by Formula 1:

$$M_pO_q \qquad \text{Formula 1}$$

wherein, in Formula 1,

M is Zn, Ti, Zr, Sn, W, Ta, Ni, Mo, Cu, V, or a combination thereof, and p and q are each independently an integer from 1 to 5.

17. An electronic apparatus, comprising the light-emitting device of claim 1.

18. The electronic apparatus of claim 17, further comprising a thin-film transistor, wherein the thin-film transistor comprises a source electrode and a drain electrode, and the first electrode of the light-emitting device is electrically connected to at least one of the source electrode and the drain electrode.

19. The electronic apparatus of claim 17, further comprising a color filter, a color conversion layer, a touch screen layer, a polarizing layer, or a combination thereof.

* * * * *